(12) United States Patent
Shimogishi et al.

(10) Patent No.: US 7,211,891 B2
(45) Date of Patent: May 1, 2007

(54) ELECTRONIC HEAT PUMP DEVICE, LASER COMPONENT, OPTICAL PICKUP AND ELECTRONIC EQUIPMENT

(75) Inventors: Kenji Shimogishi, Sakai (JP); Yoshihiko Matsuo, Yamatotakada (JP); Yoichi Tsuda, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 337 days.

(21) Appl. No.: 10/996,457

(22) Filed: Nov. 26, 2004

(65) Prior Publication Data

US 2005/0110099 A1    May 26, 2005

(30) Foreign Application Priority Data

Nov. 25, 2003  (JP) ............................. 2003-393448

(51) Int. Cl.
H01L 23/34 (2006.01)
H01L 31/058 (2006.01)
H01L 29/06 (2006.01)
H01L 23/495 (2006.01)
H01L 23/10 (2006.01)

(52) U.S. Cl. .................. 257/717; 257/468; 257/625; 257/675; 257/705; 257/706; 257/707; 257/712; 257/713; 257/714; 257/715; 257/716; 257/718; 257/719; 257/720; 257/721; 257/722; 257/930

(58) Field of Classification Search ................ 257/468, 257/625, 675, 705–707, 712–722, 930
See application file for complete search history.

(56) References Cited

U.S. PATENT DOCUMENTS

| | | | | |
|---|---|---|---|---|
| 3,649,881 A | * | 3/1972 | Chang et al. ............... | 257/717 |
| 4,855,810 A | * | 8/1989 | Gelb et al. ................... | 136/203 |
| 5,515,238 A | * | 5/1996 | Fritz et al. ................... | 361/704 |
| 6,300,150 B1 | * | 10/2001 | Venkatasubramanian ..... | 438/27 |
| 6,774,298 B2 | * | 8/2004 | Tauchi et al. ................ | 136/201 |
| 6,864,571 B2 | * | 3/2005 | Arik et al. ................... | 257/712 |
| 6,891,278 B2 | * | 5/2005 | Muller et al. ................ | 257/706 |
| 6,893,902 B2 | * | 5/2005 | Cordes et al. ............... | 438/122 |
| 6,946,730 B2 | * | 9/2005 | Teshima ....................... | 257/718 |
| 6,969,907 B2 | * | 11/2005 | Imai et al. ................... | 257/713 |
| 7,081,677 B2 | * | 7/2006 | Yamashita et al. ........... | 257/773 |
| 2005/0077619 A1 | * | 4/2005 | Ramanathan et al. ........ | 257/719 |
| 2006/0151874 A1 | * | 7/2006 | Milich et al. ................ | 257/713 |

FOREIGN PATENT DOCUMENTS

| | | |
|---|---|---|
| JP | 10-200208 A | 7/1998 |
| JP | 2002-540636 A | 11/2002 |
| WO | 99/13562 A1 | 3/1999 |
| WO | 00/59047 A1 | 10/2000 |

* cited by examiner

*Primary Examiner*—Ida M. Soward
(74) *Attorney, Agent, or Firm*—Nixon & Vanderhye, P.C.

(57) ABSTRACT

There is provided a small-size electronic heat pump device which is low in power consumption and which secures a vacuum gap without use of an additional circuit. The electronic heat pump device includes an emitter 1 and a collector 2. An electrically and thermally insulative spacer section 5 for keeping a space, i.e. vacuum gap G between an emitter electrode 11 and a collector electrode 21 constant is integrally formed in a semiconductor substrate 20 of the collector 2, which makes it possible to maintain the vacuum gap to be a specified space while a back flow of heat is prevented in a simple structure with a reduced number of component parts.

20 Claims, 23 Drawing Sheets

ELECTRONIC HEAT PUMP DEVICE, LASER COMPONENT, OPTICAL PICKUP AND ELECTRONIC EQUIPMENT

CROSS-REFERENCE TO RELATED APPLICATION

This nonprovisional application claims priority under 35 U.S.C. §119(a) on Patent Application No. 2003-393448 filed in Japan on Nov. 25, 2003, the entire contents of which are hereby incorporated by reference.

BACKGROUND OF THE INVENTION

The present invention relates to an electronic heat pump device for transporting heat from a low temperature section to a high temperature section through, for example, application of a current. The present invention also relates to a laser component for cooling a semiconductor laser diode device by using the electronic heat pump device, an optical pickup equipped with the laser component, and electronic equipment equipped with the electronic heat pump device.

In recent years, images and data recorded by writable optical disk apparatuses are rapidly expanding, by which recording rates as well as optical output from the writable semiconductor laser diodes are steadily increasing.

The semiconductor laser diode device emits light while generating heat whose energy is several times larger than that of the light, and therefore it is concerned that the heat generated by the semiconductor laser diode itself might cause fluctuation in wavelengths and decrease in life.

As an apparatus for cooling the semiconductor laser diode device, a semiconductor laser module equipped with an electronic heat pump device composed of a peltiert device module has conventionally been proposed.

The semiconductor laser module (first prior art example) is composed of, as shown in FIG. 18, a semiconductor laser diode chip (hereinbelow referred to as an LD chip) 101, a metal substrate 104 for mounting a lens, and a peltiert device 105 (see JP 10-200208 A).

The metal substrate 104 is bonded to the top portion of the peltiert device 105 through metal soldering, and for keeping the temperature of the LD chip 101 constant, a thermister 108 is mounted thereon.

Heat travels from the LD chip 101 to the upper surface of the peltiert device 105. Through application of current to the peltiert device 105, the heat moves from the upper surface of the peltiert device 105 to the lower surface, and through control over the current of the peltiert device 105 by an unshown temperature regulation circuit, it becomes possible to keep the temperature of the LD chip 101 constant.

Moreover, as an electronic heat pump device, an apparatus of vacuum diode-type structure different in structure from the peltiert device 105 has been proposed.

The apparatus of vacuum diode-type structure (second prior art), as shown in FIG. 19, functions as an electronic heat pump device in which an emitter electrode 111 and a collector electrode 112 face each other with a vacuum gap 113 interposed therebetween, and a voltage applied to a piezo device 114 for regulating the space between the emitter electrode 111 and the collector electrode 112 is feedback controlled by monitoring its electrostatic capacity so that the voltage is applied in such a way that electrons discharged from the emitter electrode 111 move to the collector electrode 112, thereby achieving transportation of heat drawn from an endoergic section 115 to an exoergic section 116 (see International Publication No. WO 99/13562).

Moreover, as another apparatus of vacuum diode-type structure (third prior art example), there is, as shown in FIG. 20, a thermionic generator of vacuum gap structure having an electron cooling function in which an emitter electrode 111 and a collector electrode 112 are supported by minute barriers 119 (see JP 2002-540636 A).

This apparatus is an apparatus utilizing a phenomenon in which when electrons are injected from the emitter electrode 111 to the barrier 119 and move from the barrier 119 to the collector electrode 112, the electrons are filtered by the barrier 119, and thereby heat moves together with the electrons.

However, the first to third prior art examples had following problems.

In the first prior art example, cooling efficiency of the peltiert device is low, and therefore energy several times larger than that the heat value generated from the semiconductor laser diode must be provided to gain sufficient cooling efficiency.

This is because, as shown in FIG. 21, the peltiert device is structured such that a first metal electrode 121a, a p-type semiconductor 106, a second metal electrode 121b, an n-type semiconductor 107 and a third metal electrode 121c are electrically connected in this sequence in series, and utilizes Peltier effect in which when a voltage is applied from the outside so as to move electrons from the p-type semiconductor 106 to the n-type semiconductor 107, heat generation occurs on the junctions through which electrons move from the first metal electrode 121a to the p-type semiconductor 106, and from the n-type semiconductor 107 to the third metal electrode 121c, whereas heat absorption occurs on the junctions through which electrons move from the p-type semiconductor 106 to the second metal electrode 121b, and from the second metal electrode 121b to the n-type semiconductor 107, resulting in generation of temperature difference between both the ends of the p-type semiconductor 106 and the n-type semiconductor 107. However, inside the p-type semiconductor 106 and the n-type semiconductor 107, there is heat current due to thermal conduction as shown by an arrow 122, which causes a problem of low cooling efficiency and large power consumption.

In the second prior art example, as shown in FIG. 22, electrons emitted from the emitter electrode 111 move to the collector electrode 112 while carrying heat, by which heat is transported by electrons. Since heat transfer from the collector electrode 112 to the emitter electrode 111 is blocked by the vacuum gap 113, one-way flow of the heat current shown by an arrow 123 is achieved, resulting in high cooling efficiency and small power consumption.

However, in this second prior art example, in order to maintain the vacuum gap 113 of 10 nm or less, the piezo device 114 shown in FIG. 19 as well as an electrostatic capacity controller 117 for feedback control of the vacuum gap 113 are required, which causes a problem that the apparatus becomes big and thereby reduction in size and weight is hindered.

Moreover, in the third prior art example, electrons transport heat from the emitter electrode 111 to the collector electrode 112 as shown in FIG. 22. However, as shown in FIG. 20, heat flows through the barrier 119 interposed in between the emitter electrode 111 and the collector electrode 112 due to thermal conduction, which causes a serious problem of poor cooling efficiency and large power consumption because of the same reason as the peltiert device.

SUMMARY OF THE INVENTION

Accordingly, an object of the present invention is to provide a subminiature electronic heat pump device which secures a vacuum gap without use of a piezo device and the like, and which implements considerable reduction in the amount of power consumption.

In order to achieve the object, there is provided an electronic heat pump device, comprising:

an emitter-side external electrode substrate;

an emitter including a semiconductor substrate having one surface connected to the emitter-side external electrode substrate so as to allow conduction of electricity and heat, and an emitter electrode provided on the other surface of the semiconductor substrate;

a collector-side external electrode substrate;

a collector including a semiconductor substrate having one surface connected to the collector-side external electrode substrate so as to allow conduction of electricity and heat, and a collector electrode provided on the other surface of the semiconductor substrate; wherein the emitter and the collector are disposed such that the emitter electrode and the collector electrode face each other with a space therebetween, and wherein at least one spacer section which keeps the space between the emitter electrode and the collector electrode constant and which are electrically and thermally insulative is integrally formed in at least one of the semiconductor substrate of the emitter and the semiconductor substrate of the controller, and further comprising:

a space retention member which is electrically and thermally insulative and disposed between the emitter-side external electrode substrate and the collector-side external electrode substrate for keeping a space between the emitter-side external electrode substrate and the collector-side external electrode substrate at a constant value; and a sealing member for maintaining vacuum between the emitter-side external electrode substrate and the collector-side external electrode substrate.

Herein, the emitter-side external electrode substrate and the collector-side external electrode substrate have electric and thermal conductivity, and are made of, for example, materials such as tungsten, tungsten carbide, copper and silicon. The semiconductor substrate of the emitter and the semiconductor substrate of the collector are made of an n-type Si substrate (wafer), for example. The space retention member is comprised of an insulative washer and a resin bolt, for example. The sealing member is electrically and thermally insulative and made of a low-melting glass, for example. The emitter electrode is composed of, for example, a thin film made of a conductive material formed on the surface of the semiconductor substrate of the emitter, which tends to easily emit electrons. The collector electrode is composed of, for example, a thin film made of a conductive material formed on the surface of the semiconductor substrate of the collector. The space in a vacuum state filters high-energy electrons moving from the emitter side to the collector side. The spacer section is integrally formed in the semiconductor substrate, for example, in such a way that thermal oxidation is applied to the surface of the semiconductor substrate made of an Si wafer to form an $SiO_2$ film and the $SiO_2$ film is etched.

According to the electronic heat pump device of the present invention, a space (vacuum gap) is present between the emitter electrode and the collector electrode, which makes it possible to provide a vacuum gap diode structure to the electronic heat pump device, and thereby allows prevention of the back flow of heat to achieve power consumption smaller than that of the Peltiert device.

Further, the spacer section which keeps the space constant and which is electrically and thermally insulative is integrally formed in at least one of the semiconductor substrate of the emitter and the semiconductor substrate of the collector, which makes it possible to maintain the vacuum gap at a specified spacing while the back flow of heat is prevented in a simple structure with a smaller number of component parts. More particularly, the piezoelectric element, the capacitance controller, the piezo feedback circuit and the like, which have been required as means to maintain the vacuum gap between the emitter and the collector at a specified spacing in the conventional electronic heat pump device of vacuum gap diode structure, become unnecessary, which makes it possible to reduce the number of component parts, thereby allowing reduction in size, weight and cost.

Further, adjusting the thickness of the spacer section so as to approximate the size of the space (vacuum gap) to a nano level enables the barrier height to be decreased and the electron emission effect of the emitter to be enhanced. More specifically, the space constitutes a barrier against electron tunneling between the emitter and the collector, and decreasing the spacing between the emitter electrode and the collector electrode allows reduction of a physical barrier height.

Further, the electronic heat pump device, which comprises the emitter-side external electrode substrate and the collector-side external electrode substrate, can be formed thinner and smaller, thereby allowing the electronic heat pump device to be installed, for example, inside a package of an existing semiconductor laser component and so on.

In one embodiment, the emitter-side external electrode substrate and the collector-side external electrode substrate have an almost rectangular parallelepiped shape.

According to the embodiment, the electronic heat pump device has an almost rectangular parallelepiped chip shape, which makes it possible to implement a subminiature electronic heat pump device. This allows the electronic heat pump device to be installed, for example, inside a package of a semiconductor laser component, thereby realizing a semiconductor laser and a hologram laser with a function of controlling laser chip temperature.

Further in one embodiment, the sealing member is brought into contact with the emitter-side external electrode substrate and the collector-side external electrode substrate.

According to the embodiment, the sealing member can surely maintain vacuum between the emitter-side external electrode substrate and the collector-side external electrode substrate.

Further in one embodiment, the sealing member includes a first sealing section which is in contact with the emitter-side external electrode substrate and the space retention member, and a second sealing section which is in contact with the collector-side external electrode substrate and the space retention member.

According to the embodiment, it becomes possible to reduce the volume of the sealing member for achieving cost reduction.

In one embodiment, values of maximum roughness Rz of a surface of the emitter electrode and a surface of the collector electrode are not more than ½ of a minimum value of the space between the emitter electrode and the collector electrode.

The "maximum roughness Rz" is an unevenness caused by, for example, warpage, waviness and rough surface.

According to the embodiment, the values of maximum roughness Rz are not more than ½ of the minimum value of the space between the emitter electrode and the collector electrode. Thus, the surfaces of both the electrodes are smoothed so as to reduce defects, which would be caused by roughness due to surface asperity of the electrodes. For example, it becomes possible to reduce short circuit failures caused by contact between both the electrodes due to surface protruding portions facing to each other, and to mitigate a drop in the electron emission amount and cooling amount caused by expansion of a space (vacuum gap) due to surface recess portions opposed to each other. More specifically, if a value of the maximum roughness Rz exceeds ½ of a maximum value of the spacing, then the electron emission amount from the emitter is reduced by expansion of the space (vacuum gap) due to the surface recess portions facing each other and warpage, and thereby the cooling amount is reduced, while the surface protruding portions facing each other may bring the two electrodes into contact with each other, thereby causing short circuit failures.

In one embodiment, values of maximum roughness Rz of a surface of the emitter electrode and a surface of the collector electrode are not more than ¼ of a minimum value of the space between the emitter electrode and the collector electrode.

According to the embodiment, the surfaces of both the electrodes are more precisely smoothed so as to reduce defects further, which would be caused by roughness due to surface asperity of the electrodes.

In one embodiment, a work function of the emitter electrode is almost equal to or lower than a work function of the collector electrode.

The term "work function" herein refers to a physical property value representing an electron emission capability of a given material in the case where certain energy (e.g., heat and electric field) is applied to the material, and electrons are extracted from a surface of the material beyond an external energy barrier (e.g., vacuum), where a lower work function signifies a larger electron emission amount.

The emitter electrode and the collector electrode are composed of a conductive composite material, and are structured such that the surface of a thin film made of, for example, Ag, Ti or Au is covered with cesium oxide.

According to the embodiment, in the case where the work function of the emitter electrode is almost equal to the work function of the collector electrode, inverting the direction of current feeding makes it possible to implement an electronic heat pump device capable of inverting the thermal transfer direction. In the case where the work function of the emitter electrode is lower than the work function of the collector electrode, it becomes possible to reduce an application voltage from the outside, resulting in reduction of power consumption. Further, when a temperature difference is generated between the two electrodes, it becomes possible to reduce an amount of thermionic emission as well as an application voltage from the outside by heating the collector side, thereby allowing reduction of power consumption.

In one embodiment, a plurality of the spacer sections are integrally formed in the semiconductor substrate of the collector, and are in contact with the emitter electrode, and a plurality of the spacer sections are disposed on the semiconductor substrate of the collector away from each other, and when a ratio of a total area of a plurality of the spacer sections in contact with the emitter electrode to an area of the emitter electrode is defined as a spacer section area ratio, a relation described below is satisfied:

(spacer section area ratio)×(spacer section thermal conductivity (W/m·K))÷(spacer section thickness (nm))$\leq 3.0 \times 10^{-6}$.

According to the embodiment, the area of the spacer sections, a dispersion pitch of the spacer sections and a thickness of the spacer sections can properly be set. A loss caused by thermal conduction through the spacer section can be reduced to not more than 10% of the cooled heat amount, resulting in reduction of power consumption.

In one embodiment, a relation described below is satisfied:

(spacer section area ratio)×(spacer section thermal conductivity (W/m·K))÷(spacer section thickness (nm))$\leq 0.12 \times 10^{-6}$.

According to the embodiment, a loss caused by thermal conduction through the spacer section may be reduced to not more than 0.5%, resulting in further reduction of power consumption.

In one embodiment, a plurality of the spacer sections are distributed almost evenly on an entire surface of the semiconductor substrate of the collector and are also aligned.

According to the embodiment, it becomes possible to keep the size of the space almost identical over the entire surface.

In one embodiment, the space retention member is in a tube shape, and a relation described below is satisfied:

(space retention member thermal conductivity (W/m·K))×(space retention member thickness (mm))÷(space retention member height (mm)) $\leq 0.6$.

Herein, the space retention member is made of a material having a coefficient of thermal expansion close to that of the semiconductor substrate of the emitter and the semiconductor substrate of the collector, and is made of, for example, a low thermal expansion coefficient glass material containing $SiO_2$ as a main ingredient.

According to the embodiment, a thickness and a height of the space retention member can properly be set. A loss caused by thermal conduction through the space retention member can be reduced to not more than 20% of the cooled heat amount, resulting in reduction of power consumption.

In one embodiment, a relation described below is satisfied:

(space retention member thermal conductivity (W/m·K))×(space retention member thickness (mm))÷(space retention member height (mm)) $\leq 0.3$.

According to the embodiment, a loss caused by thermal conduction through the space retention member can be reduced to not more than 10% of the cooled heat amount, resulting in further reduction of power consumption.

In one embodiment, the space retention member is in a rectangular tube shape.

Further in one embodiment, the semiconductor substrate of the emitter and the semiconductor substrate of the collector are almost in a rectangular parallelepiped shape, and the space retention member is in a rectangular tube shape which is in contact with the periphery portion of the emitter-side external electrode substrate and the periphery portion of the collector-side external electrode substrate so as to enclose the semiconductor substrate of the emitter and the semiconductor substrate of the collector.

In one embodiment, in the space between the emitter electrode and the collector electrode, there is present filler gas which has no substantial reaction against the emitter electrode and the collector electrode, and a relation described below is satisfied:

(filler gas free molecule thermal conductivity
(m/s·K))×(degree of vacuum of space (Pa))
≦3350.

According to the embodiment, the degree of vacuum of the space between the emitter electrode and the collector electrode can be set property. A loss caused by thermal conduction through the space (vacuum gap) can be confined to not more than 10% of the cooled heat amount, and more preferably, the loss can be reduced to not more than 0.5%, resulting in reduction of power consumption.

In one embodiment, a relation described below is satisfied:

(filler gas free molecule thermal conductivity
(m/s·K))×(degree of vacuum of space (Pa))≦67.

According to the embodiment, a loss caused by thermal conduction through the space (vacuum gap) can be reduced to not more than 0.5% of the cooled heat amount, resulting in further reduction of power consumption.

Further in one embodiment, the filler gas is rare gas such as argon, neon, krypton and xenon.

In one embodiment, the emitter-side external electrode substrate and the collector-side external electrode substrate have rigidity, Young's modulus and a thickness which prevent the emitter electrode and the collector electrode from being brought into contact by compressive force generated by a pressure difference between external atmospheric pressure and internal vacuum in a state that the space retention member is in contact with a periphery portion of the emitter-side external electrode substrate and a periphery portion of the collector-side external electrode substrate.

According to the embodiment, it becomes possible to decrease deformation on both the external electrode substrates due to atmospheric pressure, and to decrease the deformation amount of the semiconductor substrates respectively connected to the external electrode substrates, so that even in a shortest distance section where the space (vacuum gap) is narrowed by stress deformation, the emitter electrode and the collector electrode are not short-circuited, thereby making it possible to reduce initial failures of the electronic heat pump device.

In one embodiment, the emitter-side external electrode substrate and the collector-side external electrode substrate have rigidity, Young's modulus and a thickness which set a deflection deformation amount of each of the emitter-side external electrode substrate and the collector-side external electrode substrate to be not more than ¼ of a minimum value of the space between the emitter electrode and the collector electrode.

In one embodiment, the emitter-side external electrode substrate and the collector-side external electrode substrate have rigidity, Young's modulus and a thickness which set a deflection deformation amount of each of the emitter-side external electrode substrate and the collector-side external electrode substrate to be not more than ⅕ of a minimum value of the space between the emitter electrode and the collector electrode.

A laser component of the present invention comprises:

a package;

the electronic heat pump device as defined in claim 1 installed inside the package;

a semiconductor laser diode chip mounted on the emitter-side external electrode substrate of the electronic heat pump device;

a temperature detector for detecting a temperature of the semiconductor laser diode chip; and an electric power controller for controlling an electric power supplied to the electronic heat pump device so as to keep the semiconductor laser diode chip at a specified temperature based on the temperature detected by the temperature detector.

Herein, the temperature detector is, for example, a voltage sensor for detecting the temperature of the semiconductor laser diode chip through detection of a forward voltage of the semiconductor laser diode chip. Examples of the laser component include semiconductor laser components and hologram laser components.

According to the laser component of the present invention, the electronic heat pump device is provided, which allows reduction of power consumption and downsizing. Further, it becomes possible to incorporate the small-size electronic heat pump device in an existing laser component package as a replacement of a submount element, which allows use of the existing laser component without changing the mounting space. Moreover, the temperature detector and the electric power controller are provided so that only the temperature of the semiconductor laser diode chip may be kept equal to or lower than an operating environment temperature, and therefore with small power consumption in the electronic heat pump device, it becomes possible to achieve an effect of reducing current applied to the semiconductor laser diode chip, along with an effect of lengthening the life of the semiconductor laser diode chip which is brought about by reduction in heat value of the semiconductor laser diode chip.

Further, an optical pickup of the present invention comprises the laser component.

According to the optical pickup of the present invention, the laser component is provided, which makes it possible to achieve the optical pickup which ensures a stable temperature of the semiconductor laser diode chip and which is resistant to change in operating environment temperature without modification in exoergic design or modification in mounting space.

An electronic equipment of the present invention comprises the electronic heat pump device.

Herein, the electronic equipment includes, for example, a refrigerator, an air conditioner and so on.

According to the electronic equipment of the present invention, the electronic heat pump device is provided, which makes it possible to implement electronic equipment which is small in size and which allows reduction of power consumption.

According to the electronic heat pump device of the present invention, the spacer section for forming the space between the semiconductor substrates is integrally formed thereon, which makes it possible to reduce power consumption to be lower than that of the peltiert device, and further to secure the vacuum gap without using the piezo device and the like, thereby allowing reduction in the number of components and in size.

Moreover, the emitter-side external electrode substrate in an almost rectangular parallelepiped shape and the collector-side external electrode substrate in an almost rectangular parallelepiped shape are provided, which allows downsizing and facilitates incorporation of the electronic heat pump device in an existing semiconductor laser package and the like.

Further in the laser component of the present invention, the electronic heat pump device is provided, which allows downsizing and improvement in performance.

Further in the optical pickup of the present invention, the laser component is provided, which makes it possible to improve performance.

Further in the electronic equipment, the electronic heat pump device is provided, which allows downsizing and improvement in performance.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, the present invention will be described in detail in conjunction with the embodiments with reference to the accompanying drawings.

The First Embodiment

Figure 1:
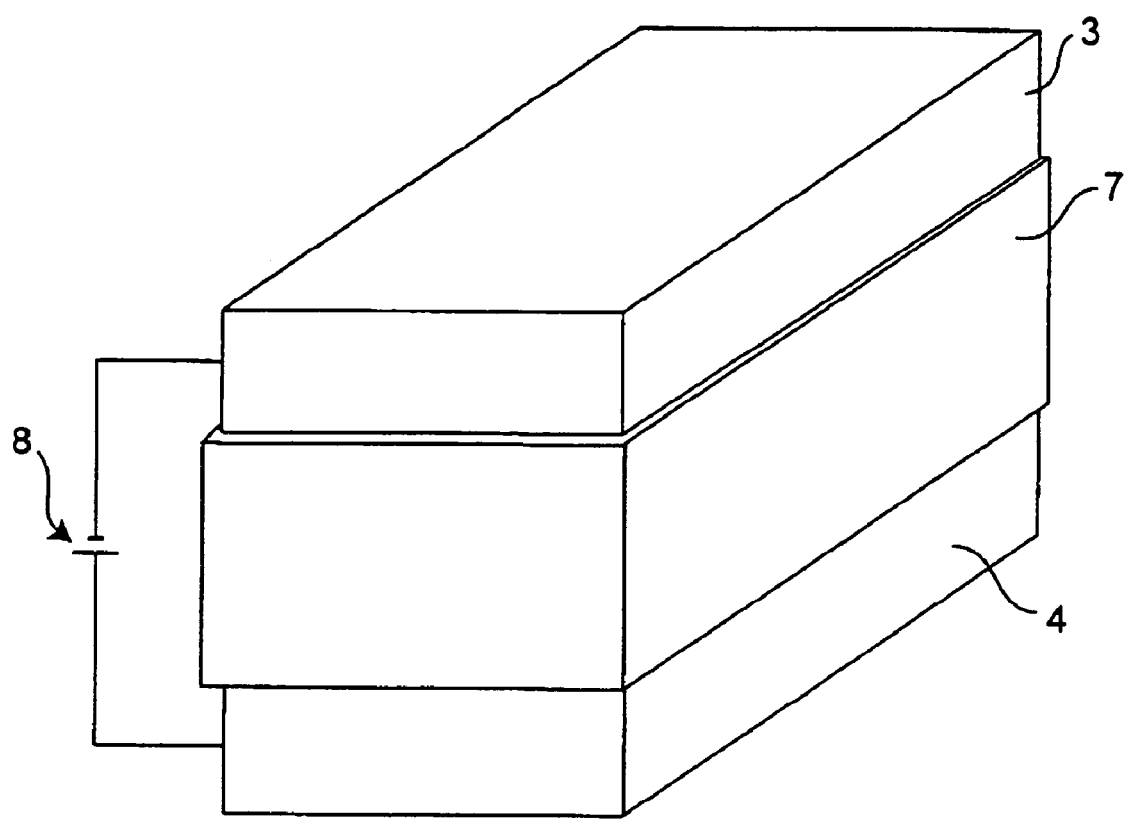
FIG. 1 is a perspective view showing an electronic heat pump device in one embodiment of the present invention.
Figure 2:
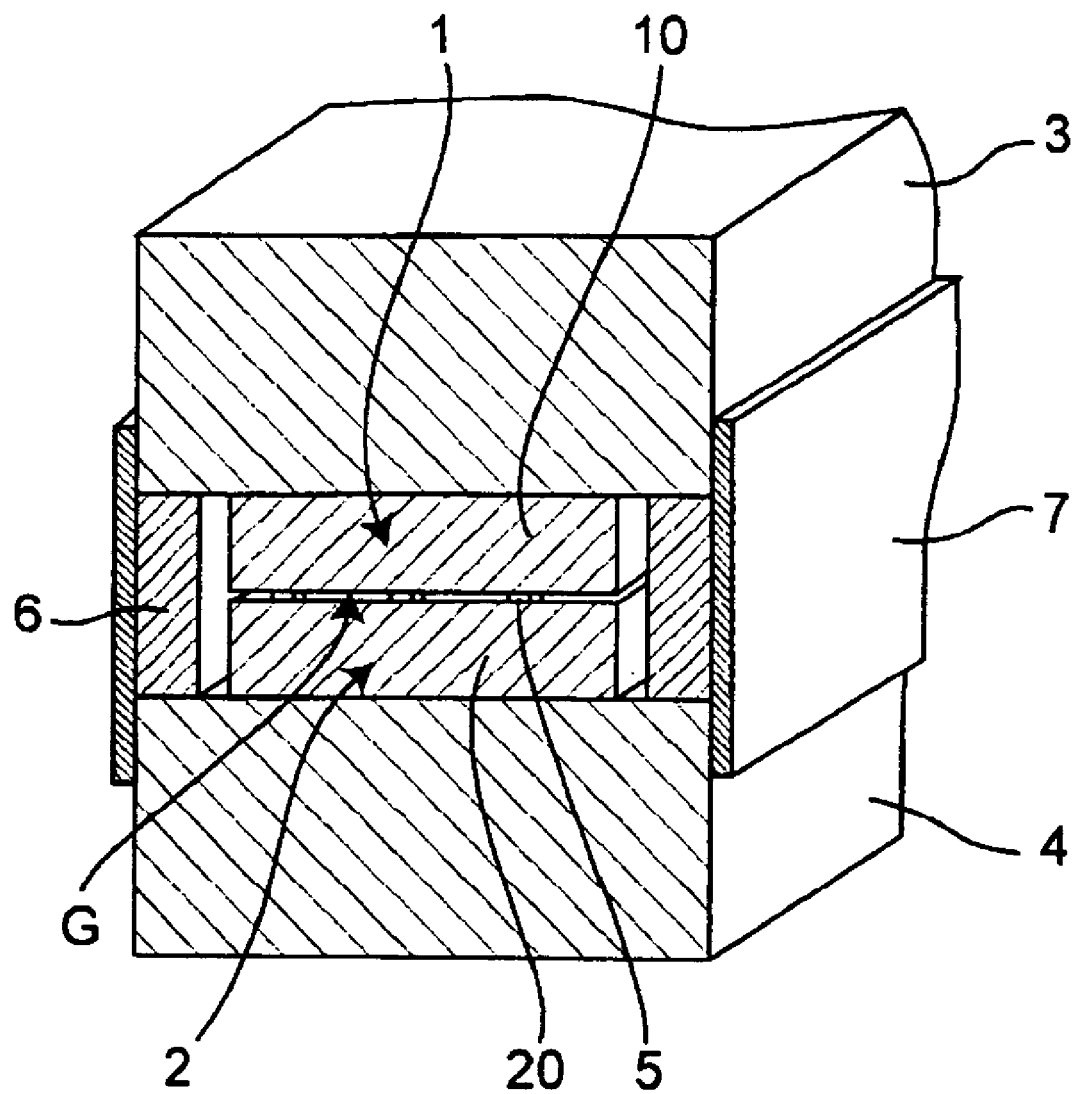
FIG. 2 is a vertical sectional view showing the electronic heat pump device.

FIG. 1 is a perspective view showing an electronic heat pump device in one embodiment of the present invention, and FIG. 2 is a sectional view showing the electronic heat pump device.

The electronic heat pump device includes an emitter-side external electrode substrate 3 having electric and thermal conductivity and having an almost rectangular parallelepiped shape, an emitter 1 which is connected to the emitter-side external electrode substrate 3 so as to allow conduction of electricity and heat and which emits electrons, a collector-side external electrode substrate 4 having electric and thermal conductivity and having an almost rectangular parallelepiped shape, a collector 2 which is connected to the collector-side external electrode substrate 4 so as to allow conduction of electricity and heat and which receives electrons, an electrically and thermally insulative space retention member 6 which is disposed between the emitter-side external electrode substrate 3 and the collector-side external electrode substrate 4 for keeping a space between the emitter-side external electrode substrate 3 and the collector-side external electrode substrate 4 constant, and a sealing member 7 for maintaining vacuum between the emitter-side external electrode substrate 3 and the collector-side external electrode substrate 4.

The electronic heat pump device has an almost rectangular parallelepiped chip shape, which is, for example, 0.7 mm wide, 1.8 mm long and 0.7 mm thick.

The emitter 1 and the collector 2 are disposed so as to face each other, and a space (vacuum gap) G is present between the emitter 1 and the collector 2. The emitter-side external electrode substrate 3 and the collector-side external electrode substrate 4 are connected to a power supply 8.

Description is now given of the operation of the electronic heat pump device. Upon application of a current from the power supply 8 to the emitter-side external electrode substrate 3 and the collector-side external electrode substrate 4, a voltage is applied to the emitter 1and the collector 2 and electrons are fed. Then, the emitter 1 side (the emitter-side external electrode substrate 3) becomes a cooling (endoergic) side, while the collector 2 side (the collector-side external electrode substrate 4) becomes an exoergic (heating) side.

Figure 3A:
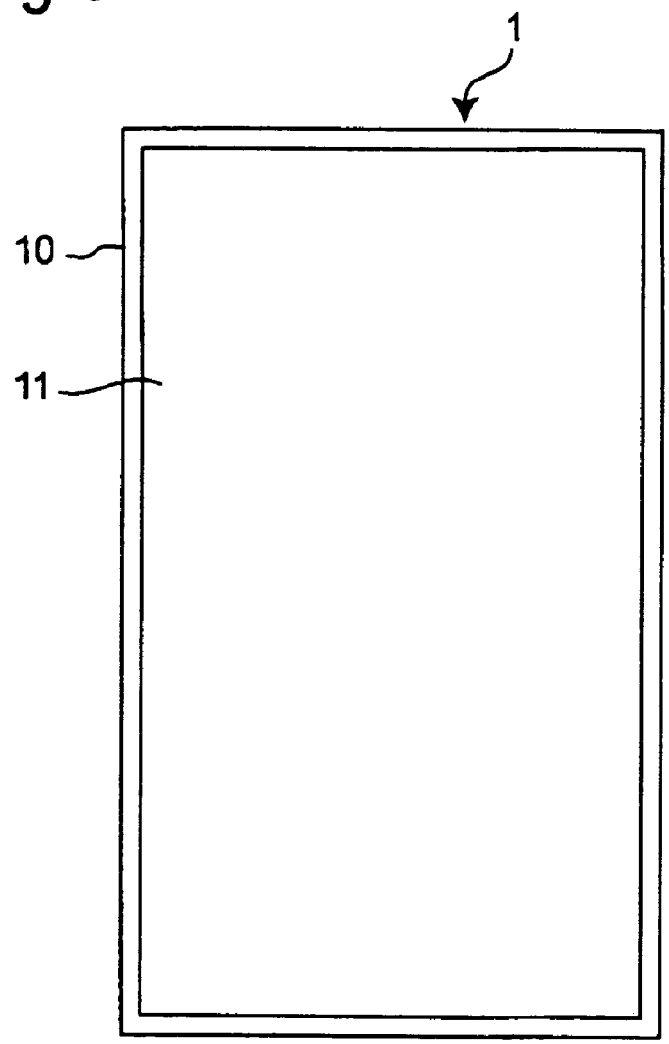
FIG. 3A is a plane view showing an emitter.
Figure 3B:
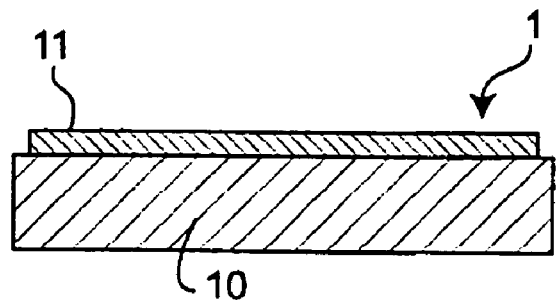
FIG. 3B is a sectional view showing the emitter.

The emitter 1 has, as shown in the plane view of FIG. 3A and the sectional view of FIG. 3B, a semiconductor substrate 10 having one surface connected to the emitter-side external electrode substrate 3 so as to allow conduction of electricity and heat, and an emitter electrode 11 provided almost entirely on the other surface of the semiconductor substrate 10.

More specifically, the semiconductor substrate 10 is an n-type silicon substrate whose surface is polished for achieving conductivity, and the emitter electrode 11 is a 5 nm-thick Ti thin film which is formed on the polished surface of the n-type silicon substrate 10 and whose surface is covered with cesium. The emitter 1 is in a rectangular parallelepiped shape and its external size is 0.3 mm×1.4 mm×0.2 mm.

Figure 4A:
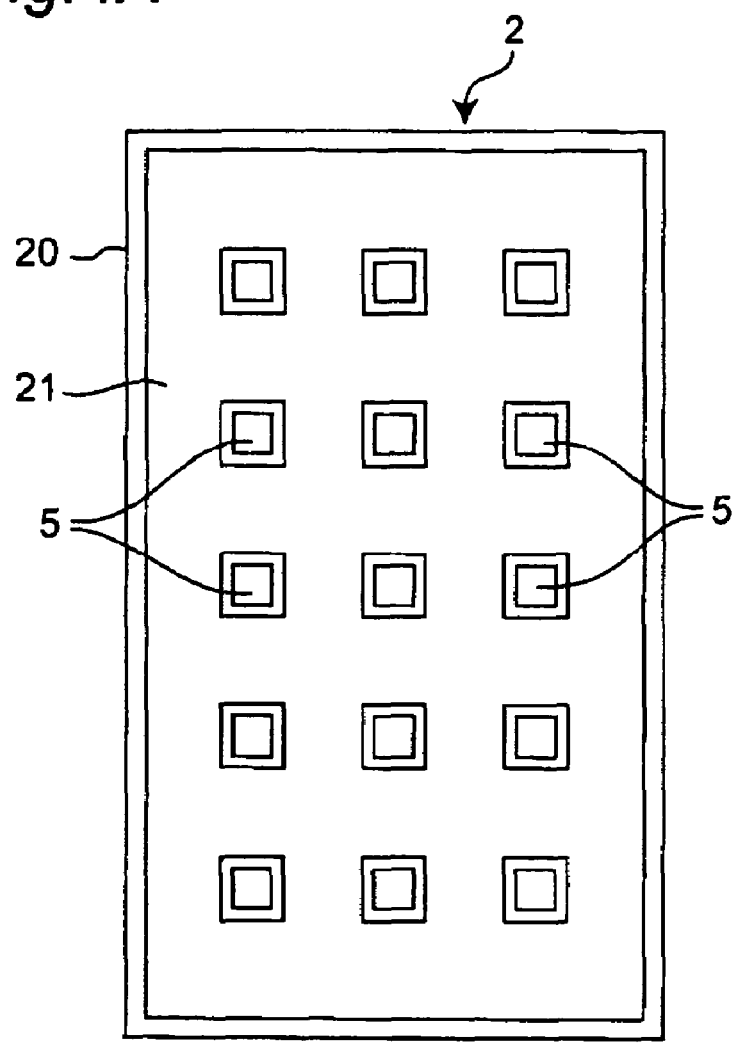
FIG. 4A is a plane view showing a collector.
Figure 4B:
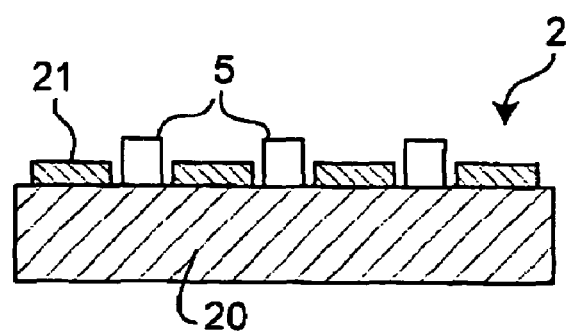
FIG. 4B is a sectional view showing the collector.

The collector 2 has, as shown in the plane view of FIG. 4A and the sectional view of FIG. 4B, a semiconductor substrate 20 having one surface connected to the collector-side external electrode substrate 4 so as to allow conduction of electricity and heat, and a collector electrode 21 provided on a part of the other surface of the semiconductor substrate 20. In the semiconductor substrate 20, the electrically and thermally insulative spacer sections 5 are integrally formed.

More specifically, the semiconductor substrate 20 is an n-type silicon substrate whose surface is polished for achieving conductivity, and a 10 nm-thick thermal oxide is formed on the polished surface of the n-type silicon substrate and is patterned with 100 nm squares by photoetching to form an oxide silicon spacer section 5 disposed at a 100 μm pitch in a square lattice configuration. A 5 nm-thick Ti thin film patterned so as to exclude the periphery of the spacer section 5 forms a collector electrode 21. The collector 2 is in a rectangular parallelepiped shape, and its external size is 0.3 mm×1.4 mm×0.2 mm. A 5 nm difference in thickness between the spacer section 5 and the collector electrode 21 composed of the Ti thin film constitutes the space G.

Figure 5A:
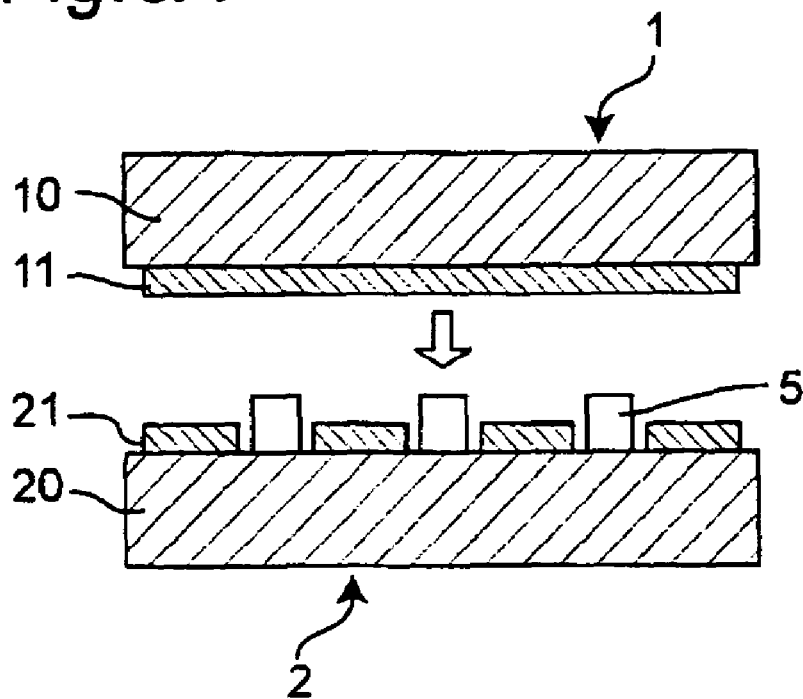
FIG. 5A is a first process view explaining the combination of the emitter and the collector.
Figure 5B:
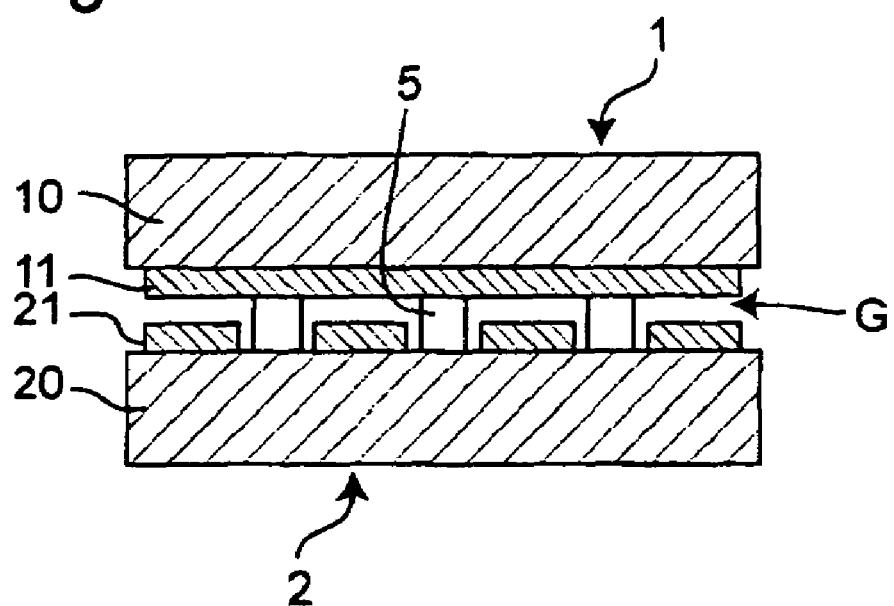
FIG. 5B is a second process view explaining the combination of the emitter and the collector.

The emitter 1 and the collector 2 are disposed such that, as shown in FIG. 5A, the emitter electrode 11 and the collector electrode 21 face each other, and the emitter electrode 11 is pressed by its own weight as shown in FIG. 5B so as to be in contact with the spacer section 5, by which the space G is evenly formed between the semiconductor substrates 10, 20.

More precisely, a plurality of the spacer sections 5 are integrally formed in the semiconductor substrate 20 of the collector 2 and are also in contact with the emitter electrode 11. Further, a plurality of the spacer sections 5 are aligned so as to be distributed almost evenly on the entire surface of the semiconductor substrate 20 of the collector 2 away from each other, by which the space G between the emitter electrode 11 and the collector electrode 21 is kept constant and the thickness of the spacer section 5 determines the size of the space G.

Values of maximum roughness Rz on the surface of the emitter electrode 11 and the surface of the collector electrode 21 are not more than ½, preferably not more than ¼, of a minimum value of the space between the emitter electrode 11 and the collector electrode 21.

Thus, since the values of maximum roughness Rz are not more than ½ of a maximum value of the space between the emitter electrode 11 and the collector electrode 21, the surfaces of both the electrodes 11 and 21 are smoothed so as to reduce defects caused by roughness due to surface asperity of both the electrodes 11 and 21.

For example, it becomes possible to reduce short circuit failures caused by contact between both the electrodes 11 and 21 due to surface protruding portions facing to each other, and to mitigate a drop in the electron emission amount and cooling amount caused by expansion of a space (vacuum gap) due to surface recess portions facing to each other.

More specifically, if a value of the maximum roughness Rz exceeds ½ of a maximum value of the space, then the electron emission amount from the emitter 1 is reduced by expansion of the space (vacuum gap) due to the surface recess portions facing each other and warpage, and thereby the cooling amount is reduced, while the surface protruding portions facing each other may bring both the electrodes 11 and 21 into contact with each other, thereby causing short circuit failures.

The work function of the emitter electrode 11 is almost equal to or lower than a work function of the collector electrode 21. The emitter electrode 11 and the collector electrode 21 are composed of a conductive composite material, and are structured such that the surface of a thin film made of, for example, Ag, Ti or Au is covered with cesium oxide.

In the case where the work function of the emitter electrode 11 is almost equal to the work function of the collector electrode 21, inverting the direction of current feeding makes it possible to implement an electronic heat pump device capable of inverting the thermal transfer direction. In the case where the work function of the emitter electrode 11 is lower than the work function of the collector electrode 21, it becomes possible to reduce an application voltage from the outside, resulting in reduction of power consumption. Further, when a temperature difference is generated between the two electrodes 11 and 21, it becomes possible to reduce an amount of thermionic emission as well as an application voltage from the outside by heating the collector 2 side, thereby allowing reduction of power consumption.

Figure 6:
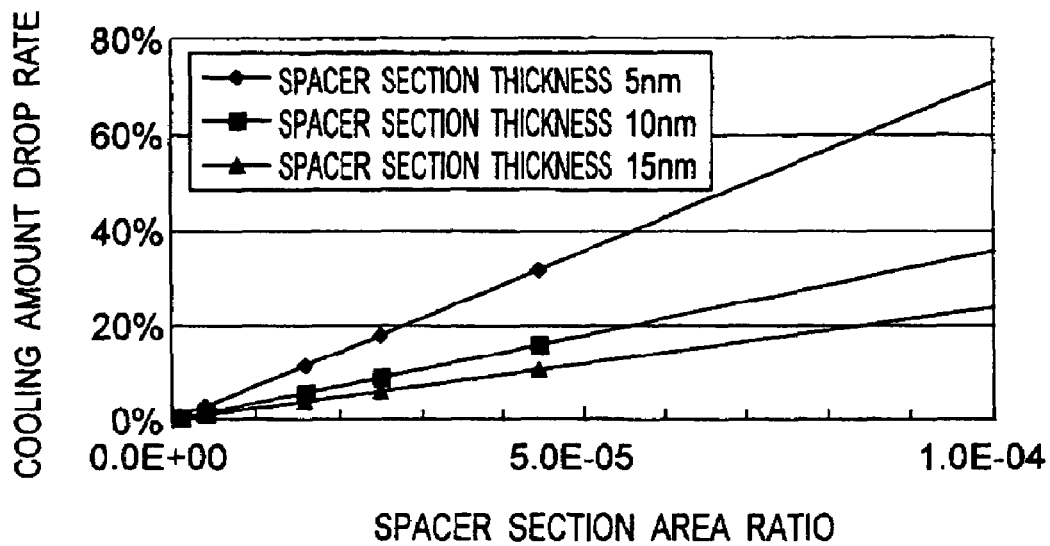
FIG. 6 is a graph chart showing the relationship between a spacer section area ratio and a cooling amount drop rate.

Now, FIG. 6 shows the relation between a spacer section area ratio and a cooling amount drop rate.

FIG. 6 is a graph on which Table 1 below is plotted.

TABLE 1

| Spacer section area ratio | Cooling Amount Drop Rate | | |
|---|---|---|---|
| | Spacer section thickness 5 nm | Spacer section thickness 10 nm | Spacer section thickness 15 nm |
| 1.0E−06 | 0.71% | 0.35% | 0.24% |
| 4.0E−06 | 2.83% | 1.41% | 0.94% |
| 1.6E−05 | 11.32% | 5.66% | 3.77% |
| 2.5E−05 | 17.69% | 8.84% | 5.90% |
| 4.4E−05 | 31.45% | 15.73% | 10.48% |
| 1.0E−04 | 70.80% | 35.40% | 23.60% |

The "spacer section area ratio" herein refers to a total area of the spacers in contact with the emitter electrode divided by an area of the emitter electrode, and the "cooling amount drop rate" is a loss due to heat conduction of the spacers divided by a cooled heat amount transported by electrons. Each spacer section is made of $SiO_2$ having low thermal conductivity, and the thermal conductivity of the spacer section is 1.2 W/m·K.

As shown in FIG. 6, the spacer section area and the heat amount which is a loss due to heat conduction are in proportional relation, and the size and pitch of the spacer sections are determined by the heat conduction loss.

More specifically, assuming that the thickness of the spacer section is 10 nm, and the spacer section area ratio is $1.0 \times 10^{-6}$, then the cooling amount drop due to the presence of the spacer sections would be about 0.35%. Accordingly, in the embodiment, the spacer sections of 3×14=42 are disposed at a pitch of 100 μm to achieve the spacer section area ratio of $1.0 \times 10^{-6}$.

The following condition should be satisfied:

(Spacer section area ratio)×(spacer section thermal conductivity [W/m·K])÷(spacer thickness [nm]) $\leq 0.12 \times 10^{-6}$.

If the pitch of the spacer section is about 25 μm, then the spacer loss is about 5.7%. Therefore, if the spacer section size is set at 200 nm square each, which is four times larger for the previous size, then the spacer section pitch should be set at 100 μm for achieving the same spacer section area ratio of $1.6 \times 10^{-5}$ so as to have a similar spacer loss of about 5.7%.

In the case where the spacer section area ratio is $2.5 \times 10^{-5}$, the spacer loss is about 8.8%, and if the spacer section area is further increased, a loss due to the spacer becomes substantive. Therefore, the configuration and the size of the spacer section are determined so as to satisfy the following condition:

(spacer section area ratio)×(spacer section thermal conductivity (W/m·K))÷(spacer section thickness (nm))$\leq 3.0 \times 10^{-6}$.

Figure 7:
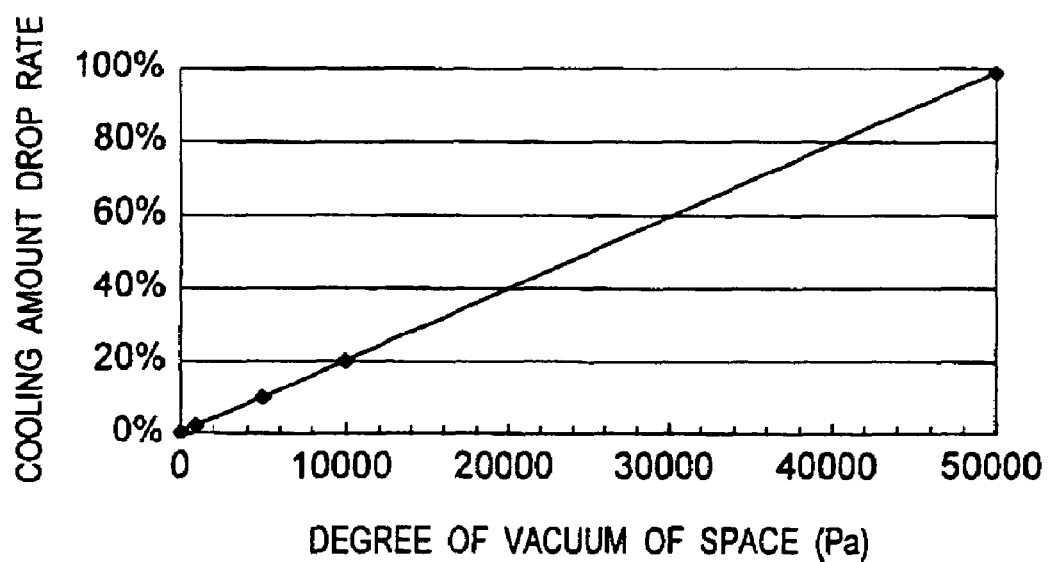
FIG. 7 is a graph chart showing the relation between the degree of vacuum of a space and the cooling amount drop rate.

Next, FIG. 7 shows the relation between a degree of vacuum and a cooling amount drop rate.

FIG. 7 is a graph on which Table 2 below is plotted.

TABLE 2

| Degree of vacuum (Pa) | Cooling amount drop rate |
|---|---|
| 100 | 0.2% |
| 1000 | 2.0% |
| 5000 | 9.9% |
| 10000 | 19.7% |
| 50000 | 98.7% |

The "degree of vacuum" herein refers to a degree of vacuum of a space (vacuum gap), and the "cooling amount drop rate" is a loss due to heat conduction in the space (vacuum gap) divided by a cooled heat amount transported by electrons. Argon gas (filler gas) with free molecule thermal conductivity of 0.67 m/s·K is filled in the space. A rare gas such as He, Ne, Kr and so on may be filled in the space in place of argon gas.

As shown in FIG. 7, a degree of vacuum in the vacuum gap between the emitter and collector and a cooling amount drop rate are in proportional relation, and the degree of vacuum is determined by the heat conduction loss. More specifically, by keeping the vacuum so that a degree of vacuum is 100 Pa or less, a loss due to heat conduction in the vacuum gap can be confined to about 0.2%.

That is, the following condition is satisfied:

(Filler gas free molecule thermal conductivity [m/s·K])×(degree of vacuum of the space [Pa]) $\leq 67$.

In the case where a degree of vacuum is lowered to about 5000 Pa, a heat conduction loss of the vacuum gap becomes around 9.9%, and if the degree of vacuum becomes lower than that, a heat conduction loss becomes substantive.

More precisely, the degree of vacuum is kept so as to satisfy the following condition:

(Filler gas free molecule thermal conductivity [m/s·K])×(degree of vacuum of the space [Pa]) $\leq 3350$.

Next, the space retention member 6 is made of a boron silicate glass material having thermal conductivity of 1.2 W/m.K and having a low coefficient of thermal expansion close to that of the silicon semiconductor substrates 10, 20. Though unshown, the thickness of the space retention member 6 is in proportion to the loss due to thermal conduction.

Accordingly, in the embodiment, the space retention member 6 is formed into a square cylinder shape with a thickness of 0.1 mm and a height of 0.4 mm, and its external size is 0.7 mm wide and 1.8 mm depth, which makes it possible to suppress the thermal conduction loss by the space retention member 6 to the level of about 8%.

More precisely, the following condition is satisfied:

(space retention member thermal conductivity (W/m·K))×(space retention member thickness (mm))÷(space retention member height (mm)) $\leq 0.3$.

In the case where the thickness of the space retention member 6 is increased to 0.2 mm, the thermal conduction loss becomes 16%, and further increase of the thickness makes the thermal conduction loss substantive.

More precisely, the thickness of the space retention member 6 is kept so as to satisfy the following condition:

(space retention member thermal conductivity (W/m·K))×(space retention member thickness (mm))÷(space retention member height (mm)) $\leq 0.6$.

Next, the emitter-side external electrode substrate 3 and the collector-side external electrode substrate 4 have rigidity, Young's modulus and a thickness which prevent the emitter electrode 11 and the collector electrode 21 from being brought into contact by compressive stress generated by a pressure difference between external atmospheric pressure and internal vacuum in the state that the space retention member 6 is in contact with the periphery portion of the emitter-side external electrode substrate 3 and the periphery portion of the collector-side external electrode substrate 4.

More specifically, the emitter-side external electrode substrate 3 and the collector-side external electrode substrate 4 are made of tungsten which is a material with high rigidity so as to prevent the space G from being short-circuited by stress deformation due to compressive stress, and their sizes are set at 0.7 mm×1.8 mm×0.15 mm so as to confine an amount of deflection due to atmospheric pressure to about 0.76 nm.

It is to be noted that as a material of the emitter-side external electrode substrate 3 and the collector-side external electrode substrate 4, tungsten carbide, copper and silicon may be used in addition to tungsten. By adjusting the thickness of the emitter-side external electrode substrate 3 and the collector-side external electrode substrate 4, the deflection amount may be suppressed to not more than 1 nm, that is ⅕ of the size of the space G of 5 nm, which becomes the material suitable for the emitter-side external electrode substrate 3 and the collector-side external electrode substrate 4.

Description is now given of a manufacturing method of the electronic heat pump device of the present invention.

First, the emitter-side external electrode substrate 3 and the collector-side external electrode substrate 4 are respectively cut away from a tungsten chin plate to be a size of 0.7 mm×1.8 mm×0.15 mm.

Figure 8A:
FIG. 8A is a view showing a first process of an emitter manufacturing method.

Description is now given of a manufacturing method of the emitter 1. As shown in FIG. 8A, one surface (top surface) of a mirror-finished n-type Si wafer substrate 6 with a length of 6 inch and a thickness of 0.2 mm is entirely polished to an extremely mirror-smooth state to the extent of a sub-nano level by, for example, CVM (Chemical Vaporization Machining) and EEM (Elastic Emission Machining). It is to be noted that an Au electrode (not shown) for contact is provided on the other surface (back surface) of the Si wafer substrate 12.

Figure 8B:
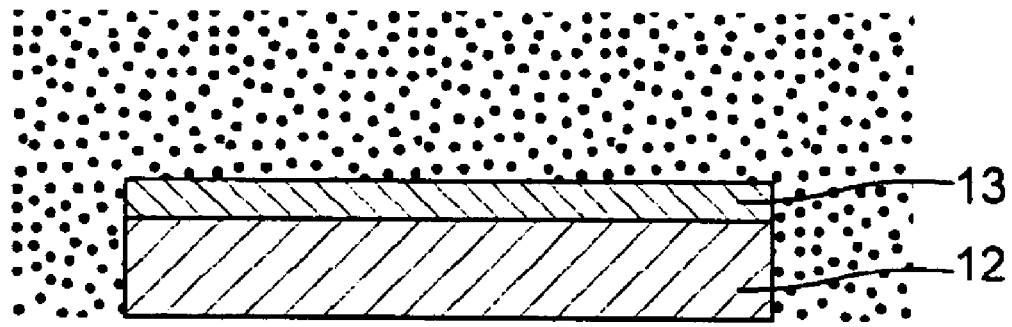
FIG. 8B is a view showing a second process of the emitter manufacturing method.
Figure 8C:
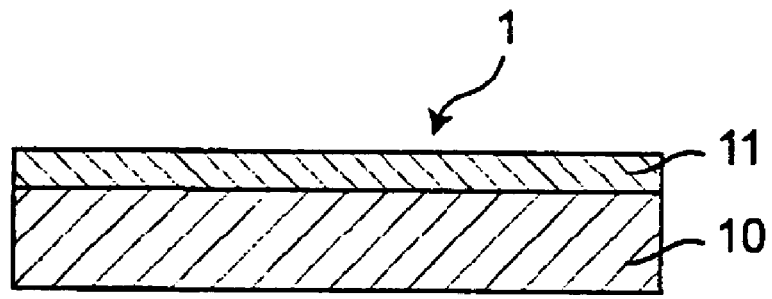
FIG. 8C is a view of a third process of the emitter manufacturing method.

Then, as shown in FIG. 8B, a Ti thin film 13 whose surface is covered with cesium by spattering or the like is formed to a thickness of, for example, 5 nm on the smooth and clear surface of the Si water substrate 12. Then, the wafer is diced in the size of 0.3 mm×1.4 mm×0.2 mm to manufacture the emitter 1 composed of the semiconductor substrate 10 made of the Si wafer substrate 12 and the emitter electrode 11 made of the Ti thin film 13 as shown in FIG. 8C.

It is to be noted that after the spattering step, the manufacturing operation proceeds with dry vacuum steps. Further, as the dicing method, for example, a method called stealth dicing for cutting a wafer without causing mechanical deformation to the wafer is most preferable.

Figure 9:
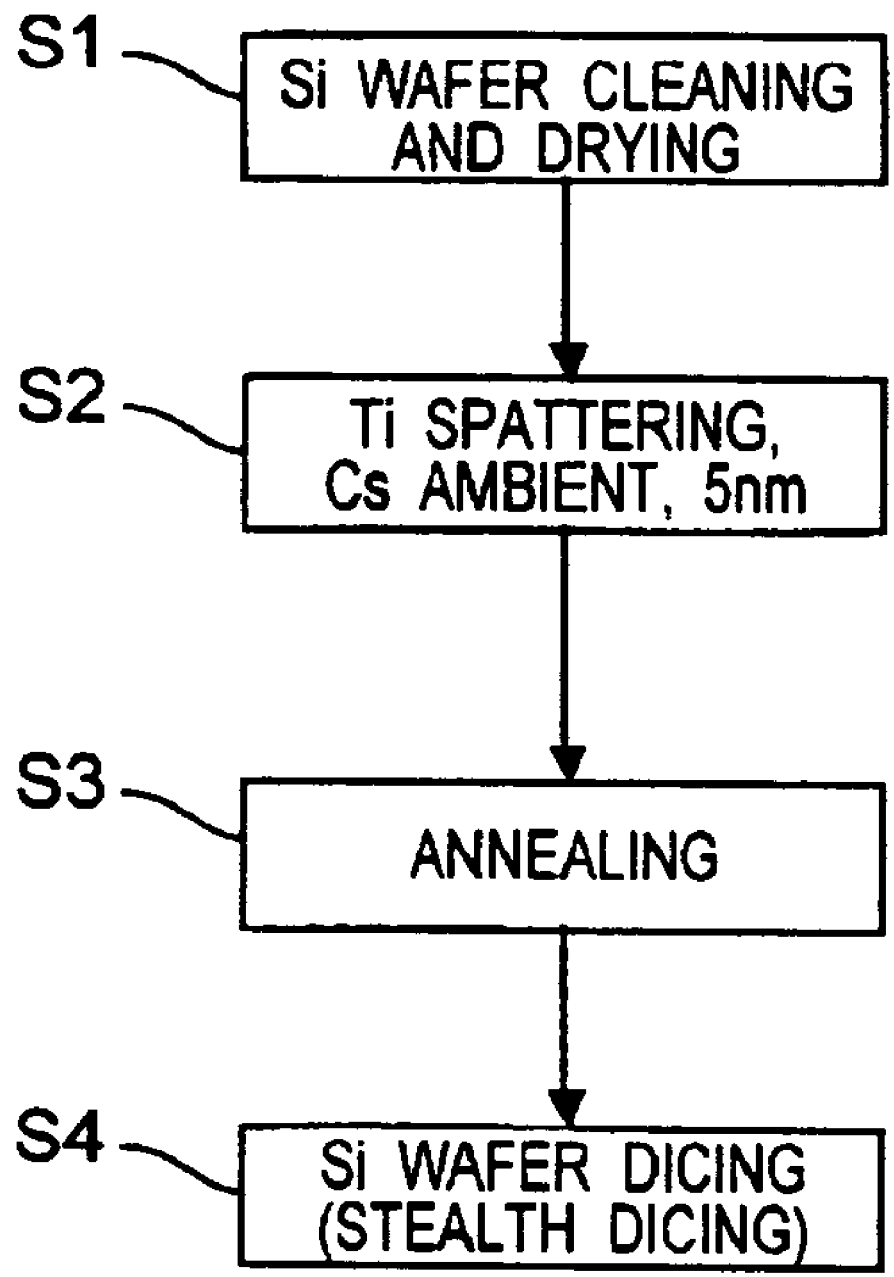
FIG. 9 is a flow chart showing the emitter manufacturing method.

A manufacturing method of the emitter 1 is shown in the step S1 to the step S4 in the flow chart of FIG. 9, though description thereof is omitted to avoid the overlap of the description.

Figure 10A:
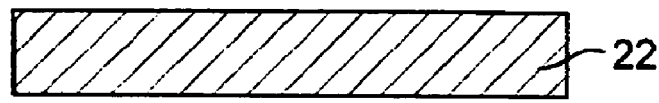
FIG. 10A is a view showing a first process of a collector manufacturing method.

Description is now given of a manufacturing method of the collector 2. As with the manufacturing method of the emitter 1, as shown in FIG. 10A, one surface (top surface) of a mirror-finished n-type Si wafer substrate 22 with a diameter of 6 inch and a thickness of 0.2 mm is entirely polished to an extremely mirror-smooth state to the extent of a sub-nano level. It is to be noted that although unshown, an Au electrode for contact is provided on the other surface (back surface) of the Si wafer substrate 22.

Figure 10B:
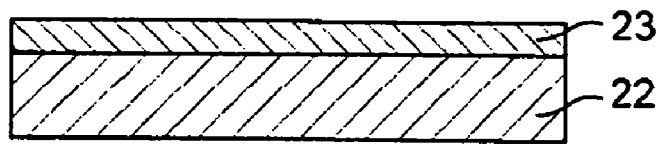
FIG. 10B is a view showing a second process of the collector manufacturing method.
Figure 10C:
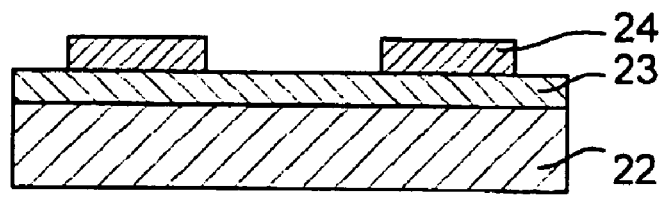
FIG. 10C is a view showing a third process of the collector manufacturing method.
Figure 10D:
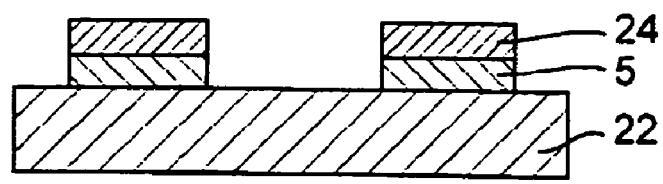
FIG. 10D is a view showing a fourth process of the collector manufacturing method.

Then, as shown in FIG. 10B, the smooth and clean surface of the Si wafer substrate 22 is subjected to thermal oxidation to form an $SiO_2$ insulating film 23 with a thickness of 10 nm, and a first resist 24 is placed over the $SiO_2$ insulating film 23 as shown in FIG. 10C. Then, as shown in FIG. 10D, photoetching is performed to pattern the $SiO_2$ insulating film 23 into 100 nm squares so as to form oxide silicon spacer sections 5 disposed in a square lattice configuration at a pitch of 100 nm.

Figure 10E:
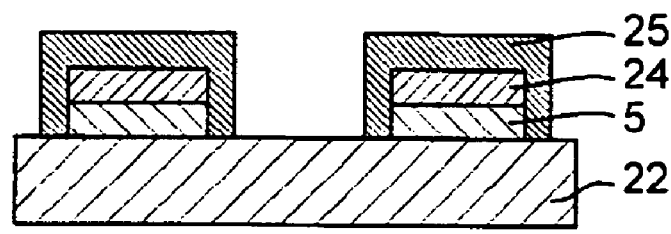
FIG. 10E is a view showing a fifth process of the collector manufacturing method.
Figure 10F:
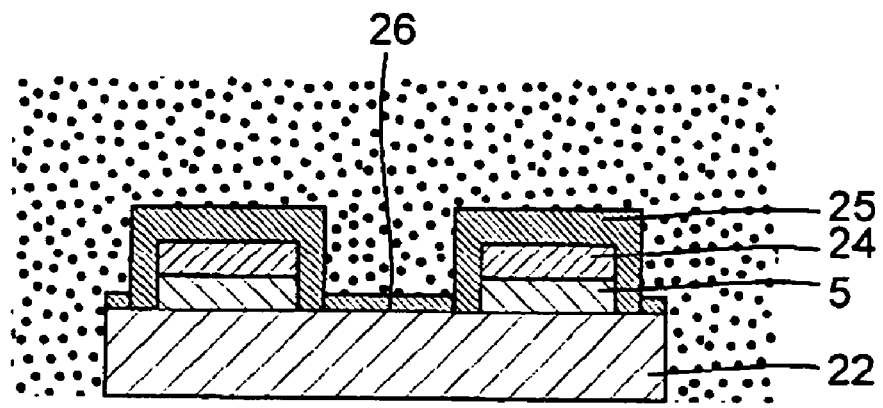
FIG. 10F is a view showing a sixth process of the collector manufacturing method.

Then, after the Si wafer substrate 22 is cleaned and dried, a second resist 25 is placed over the spacer section 5 and the first resist 24 as shown in FIG. 10E, and on one surface of the Si wafer substrate 22, a Ti thin film 26 is formed to a thickness of, for example, 5 nm by spattering and the like as shown in FIG. 10F.

Figure 10G:
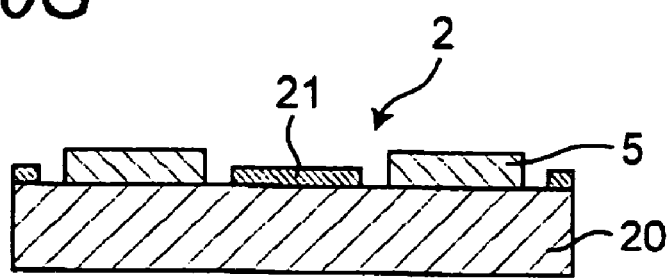
FIG. 10G is a view showing a seventh process of the collector manufacturing method.
Figure 11:
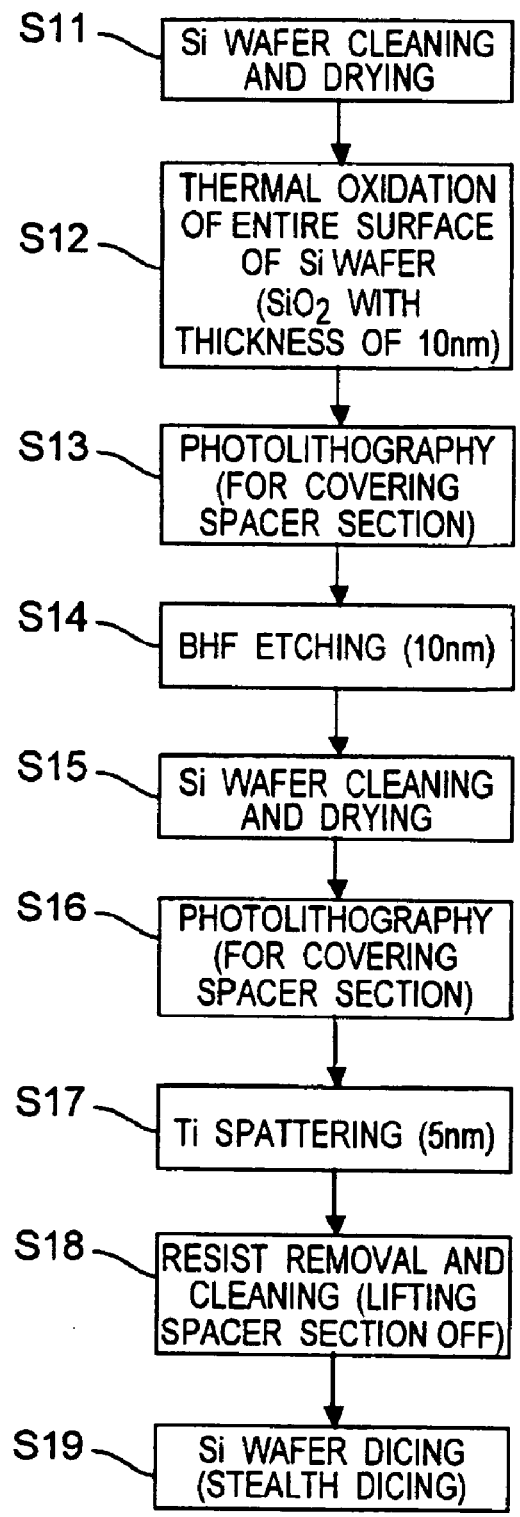
FIG. 11 is a flow chart showing the collector manufacturing method.

After that, the first resist 24 and the second resist 25 are removed, and the Si wafer substrate 22 is cleaned and diced into a size of 0.3 mm×1.4 mm×0.2 mm, by which the collector 2 which has the semiconductor substrate 20 composed of the Si wafer substrate 22 with the spacer section 5 integrally formed on one surface thereof and the collector electrode 21 made of the Ti thin film 26 are manufactured as shown in FIG. 10G. A manufacturing method of the collector 2 is shown in the step S11 to the step S19 in the flow chart of FIG. 11, though description thereof is omitted as it is redundant.

Figure 12A:
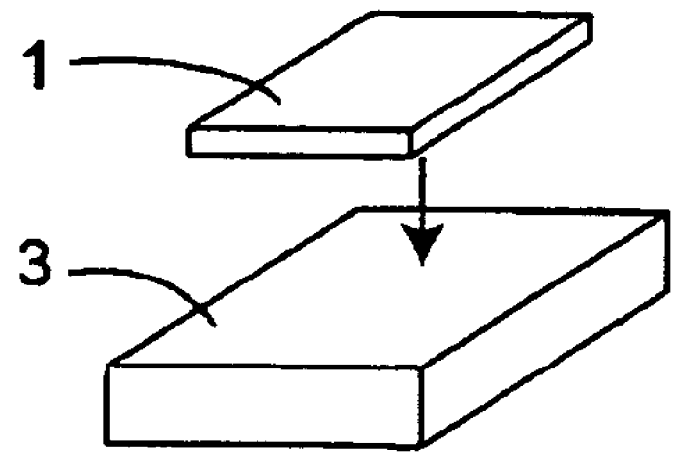
FIG. 12A is a first process view explaining the combination of an emitter and an emitter-side external electrode substrate.
Figure 12B:
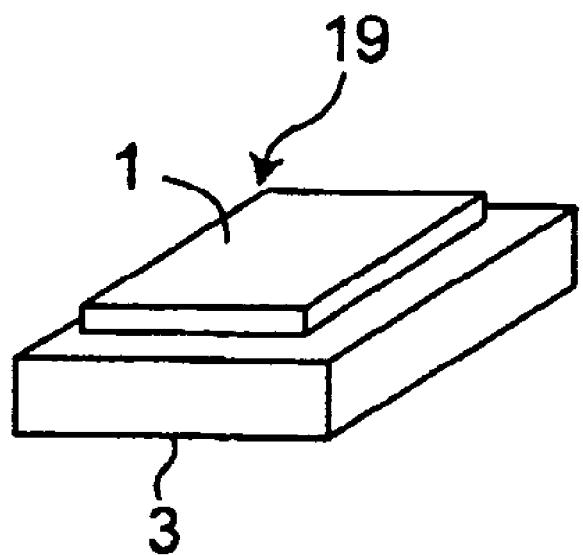
FIG. 12B is a second process view explaining the emitter and the emitter-side external electrode substrate.

Next, as shown in FIG. 12A, the emitter 1 is brought close to the emitter-side external electrode substrate 3, and as shown in FIG. 12B, with eutectic such as Au—Su as a brazing filler material, the emitter 1 is electrically and thermally bonded to the emitter-side external electrode substrate 3 to form an emitter-side unit 19. Further, though unshown, the collector 2 is electrically and thermally bonded to the collector-side external electrode substrate 4 to form a collector-side unit in the same manner.

After that, for degassing, all the components for use in the following steps including the emitter-side unit 19 and the collector-side unit are baked at a high temperature (vacuum heating (vacuum degassing)). It is to be noted that from this step to the completion of the apparatus, all the process is performed under vacuum condition so as to secure the inside vacuum gap.

Figure 13A:
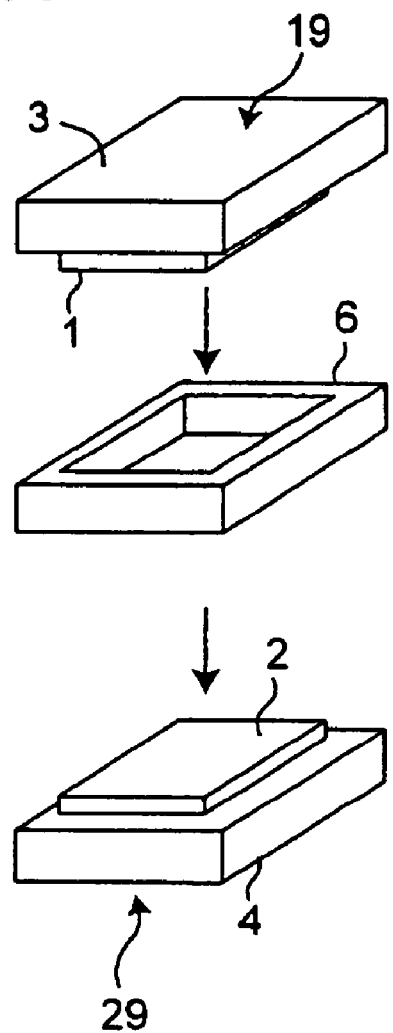
FIG. 13A is a first process view explaining the combination of an emitter-side unit, a space retention member and a collector-side unit.
Figure 13B:
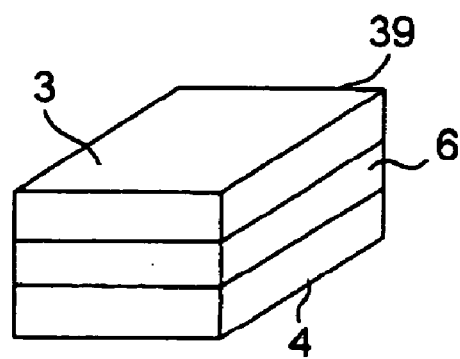
FIG. 13B is a second process view explaining the combination of the emitter-side unit, the space retention member and the collector-side unit.

Then, as shown in FIG. 13A, the space retention member 6 is placed on the collector-side unit 29 so as to cover the periphery of the collector 2, and further, the emitter 1 of the emitter-side unit 19 is die-bonded so as to be fit in the aperture of the space retention member 6, by which, as shown in FIG. 13B, an intermediate 39 in an almost rectangular parallelepiped shape is formed.

Figure 14A:
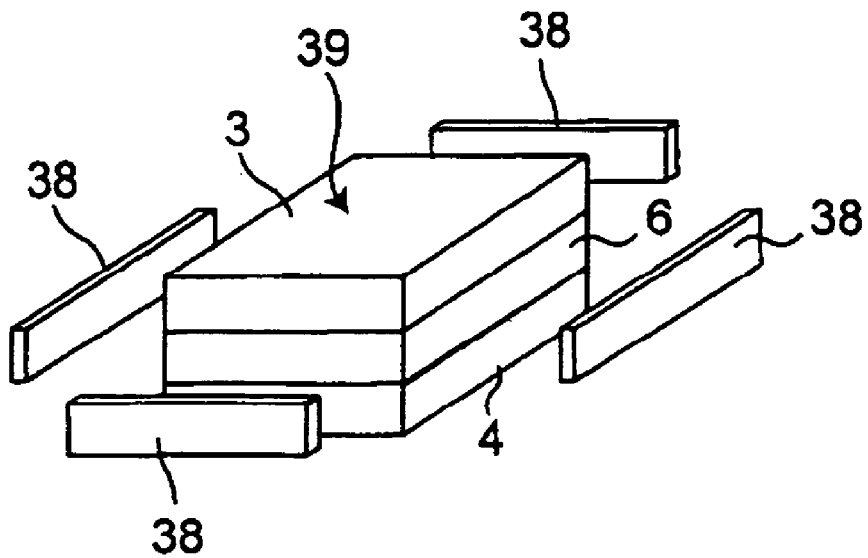
FIG. 14A is a first process view explaining the combination of an intermediate and a sealing member.
Figure 14B:
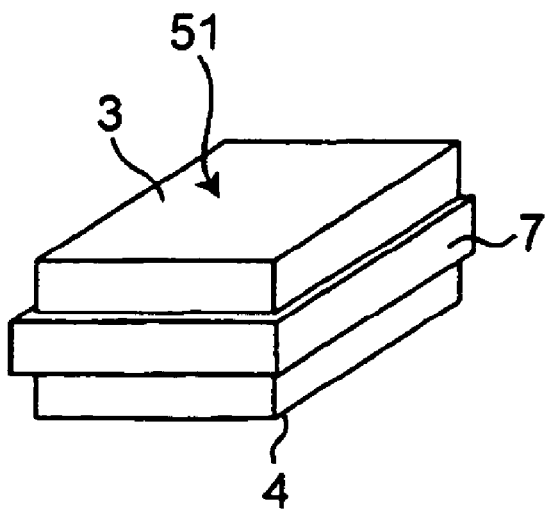
FIG. 14B is a second process view explaining the combination of the intermediate and the sealing member.

Then, as shown in FIG. 14A, in order to bond both external electrode substrates 3, 4 and the space retention member 6, four preform products 38 made of a low-melting glass material are pressed to the four side surfaces of the intermediate 39 and are subjected to heating treatment. Thus, as shown in FIG. 14B, a frit seal (the sealing member 7) is completed and an electronic heat pump device 51 is completed.

Figure 15:
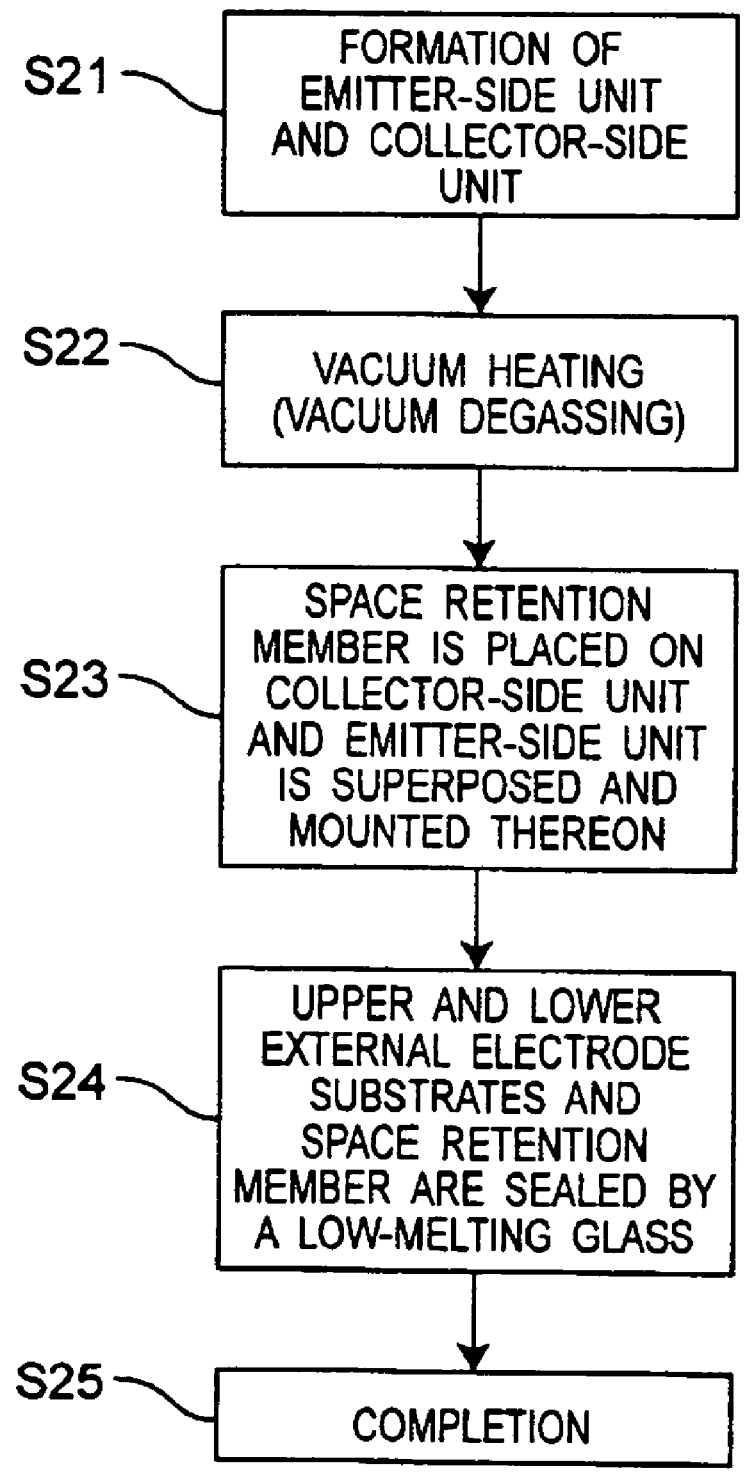
FIG. 15 is a flow chart showing a method for manufacturing an electronic heat pump device from the emitter-side unit and the collector-side unit.

It is to be noted that the process from the step for forming the emitter-side unit 19 and the collector-side unit 29 to the completion of the electronic heat pump is shown in the step S21 to the step S25 in the flow chart of FIG. 15, though description thereof is omitted as it is redundant.

According to the above-structured electronic heat pump device, the spacer sections 5 are integrally formed on one surface of the semiconductor substrate 20 of the collector 2. This makes it possible to realize an electronic heat pump device which, with a simple structure, keeps the vacuum gap at a specified size while preventing a back flow of heat. More specifically, the piezoelectric element, the capacitance controller, the piezo feedback circuit and the like, which have been required as measures to maintain the vacuum gap between the emitter and the collector at a specified size in the conventional electronic heat pump devices of vacuum gap diode structure, become unnecessary, which makes it possible to reduce the number of component parts, thereby allowing reduction in size, weight and cost.

Further, since the emitter-side external electrode substrate 3 in an almost rectangular parallelepiped shape and the collector-side external electrode substrate 4 in an almost rectangular parallelepiped shape are used, the electronic heat pump device may be formed into an almost rectangular parallelepiped chip shape, which facilitates incorporation of the electronic heat pump device in, for example, a new or existing package of semiconductor lasers and the like.

Thus, the subminiature electronic heat pump device can be realized, which makes it possible to, for example, install the electronic heat pump device in a package of a semiconductor laser device, thereby implementing a semiconductor laser device and a hologram laser with a function of controlling laser chip temperature.

The Second Embodiment

Figure 16:
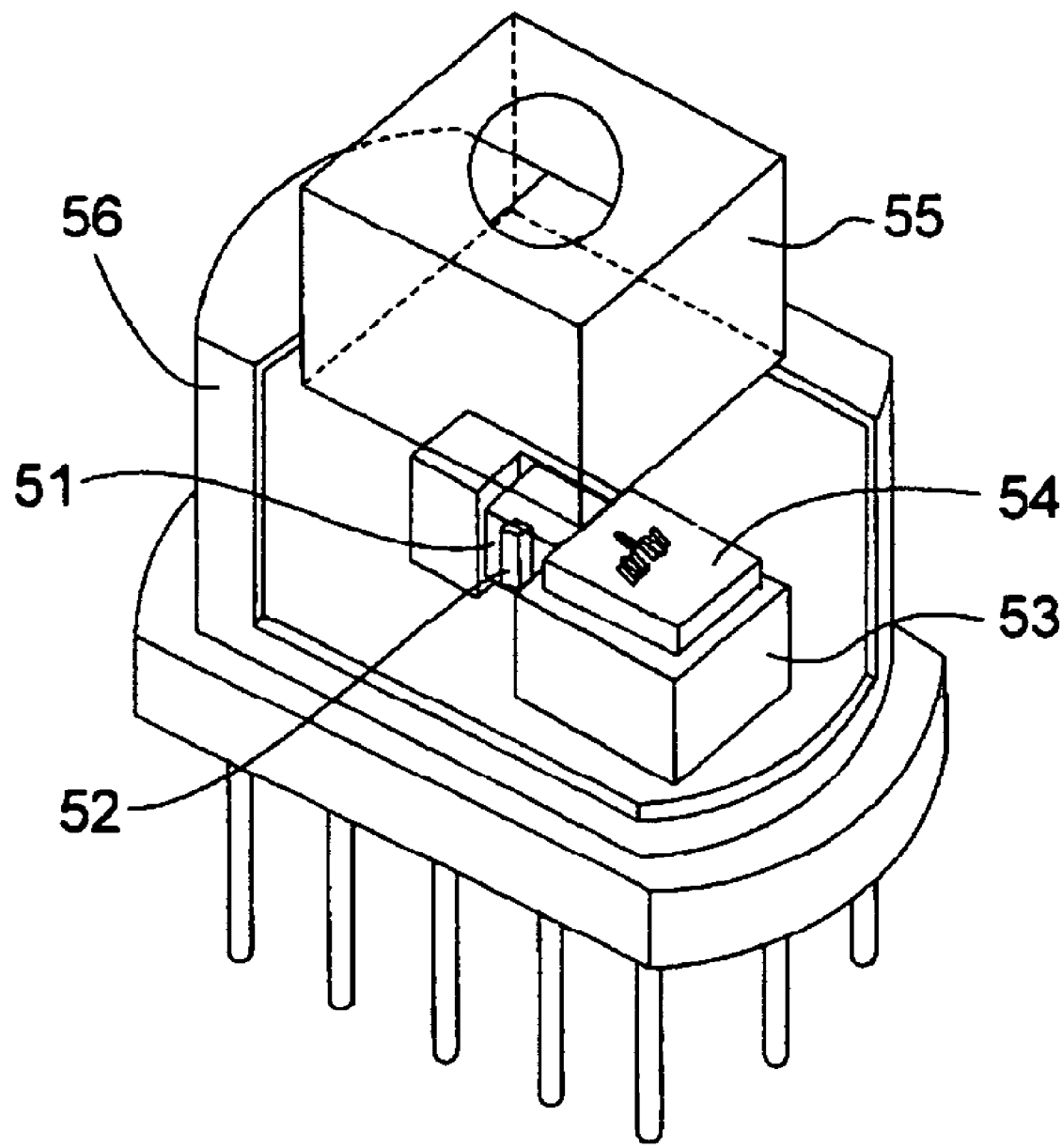
FIG. 16 is a fragmentary cutaway perspective view showing a laser component in one embodiment of the present invention.
Figure 17:
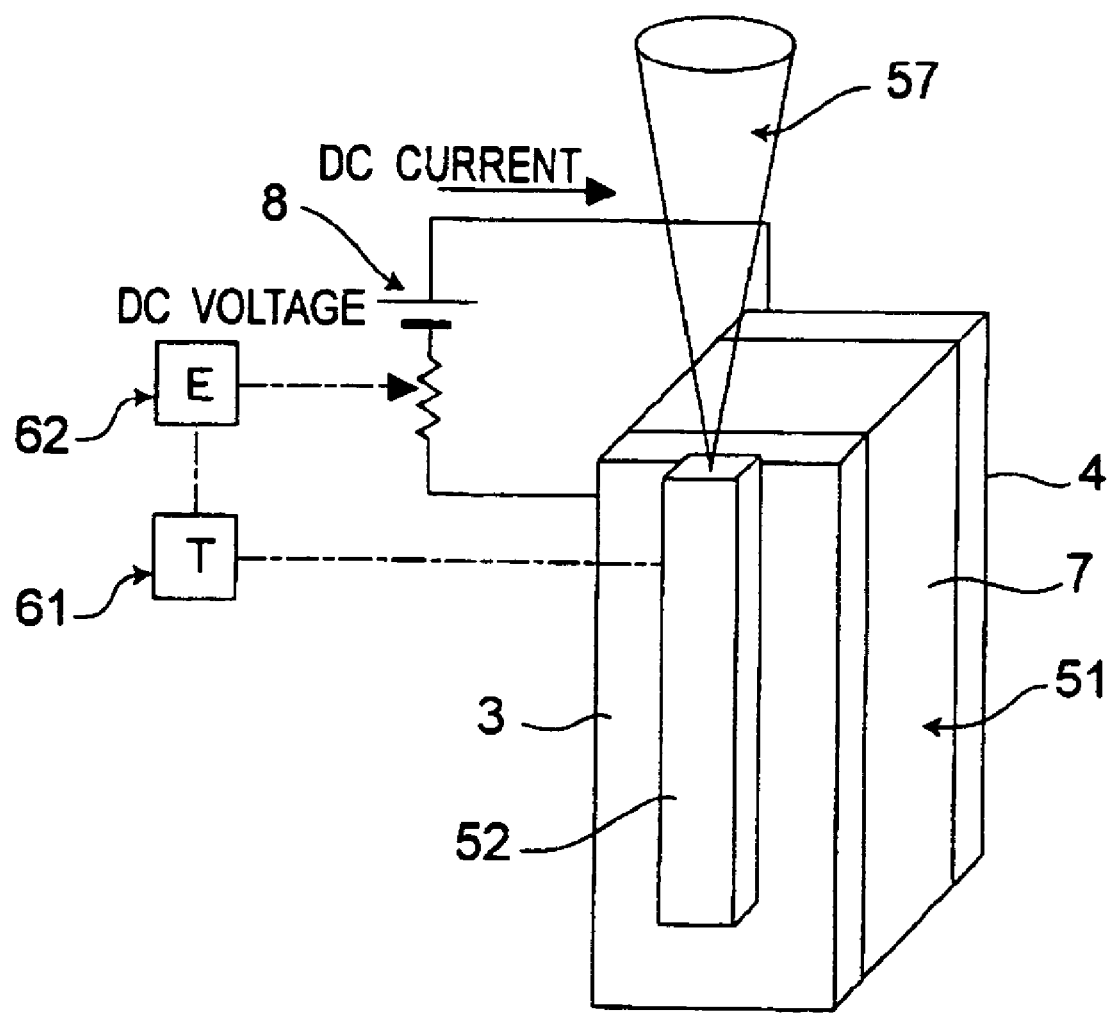
FIG. 17 is a view explaining a constitution of a main portion of the laser component.
Figure 18:
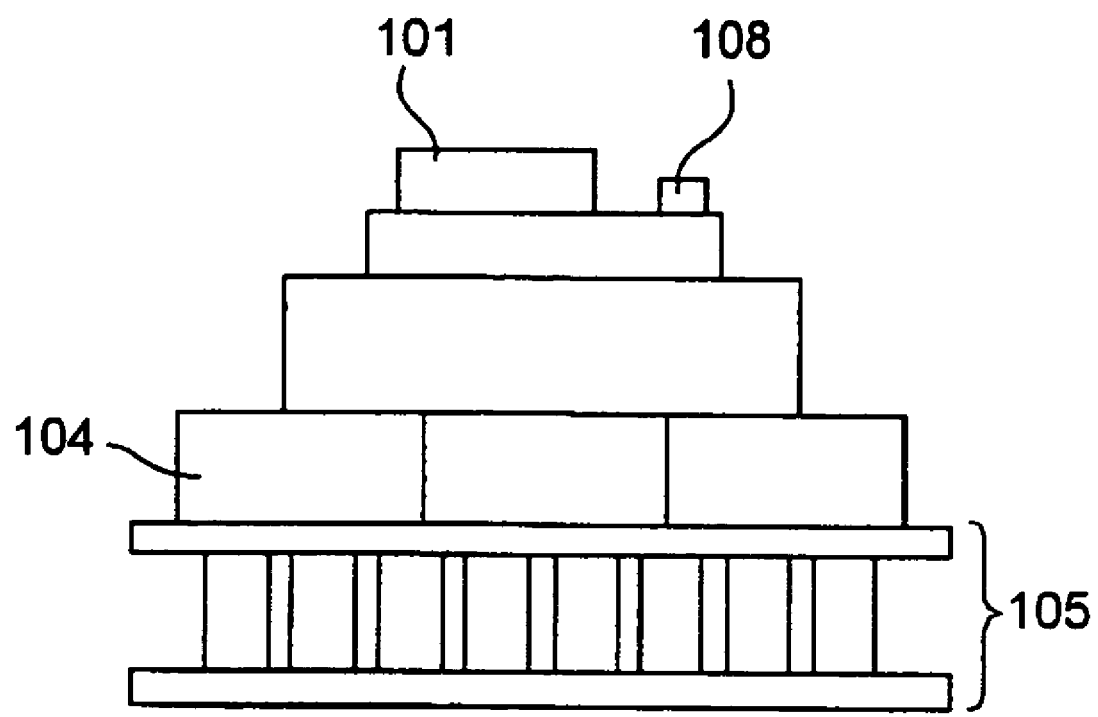
FIG. 18 is a simplified view showing a constitution of a conventional peltiert device-incorporated laser component (first prior art example)
Figure 19:
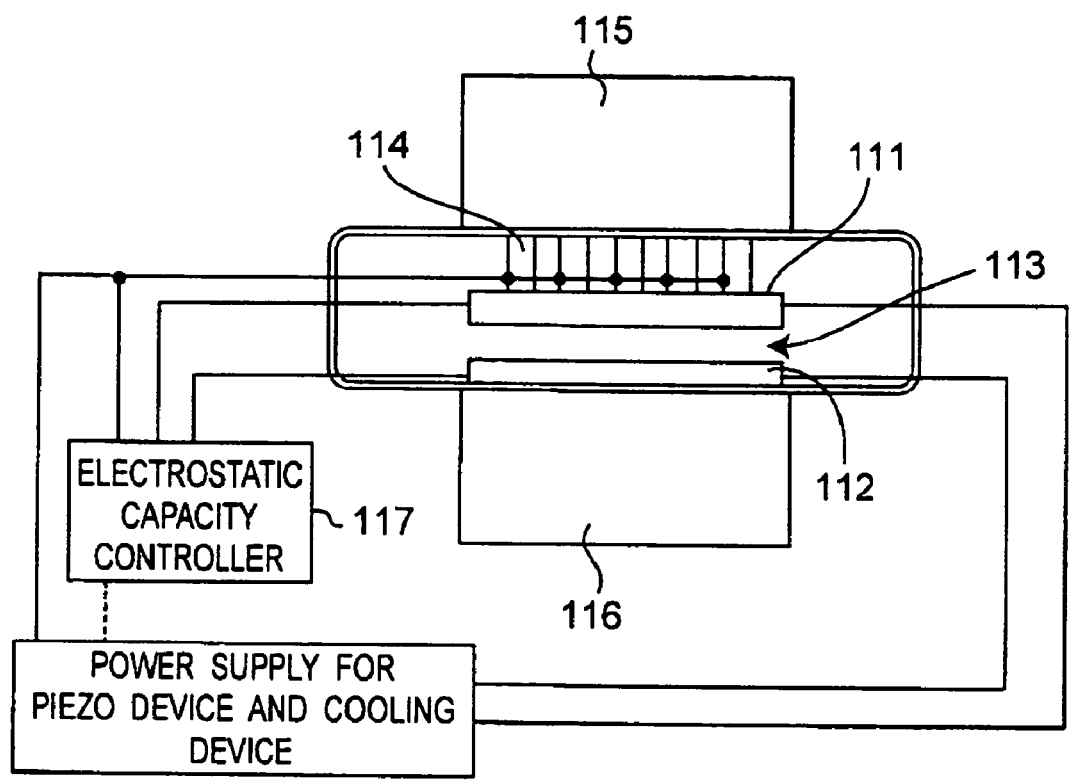
FIG. 19 is a simplified view showing a conventional vacuum diode-type electronic heat pump device (second prior art example)
Figure 20:
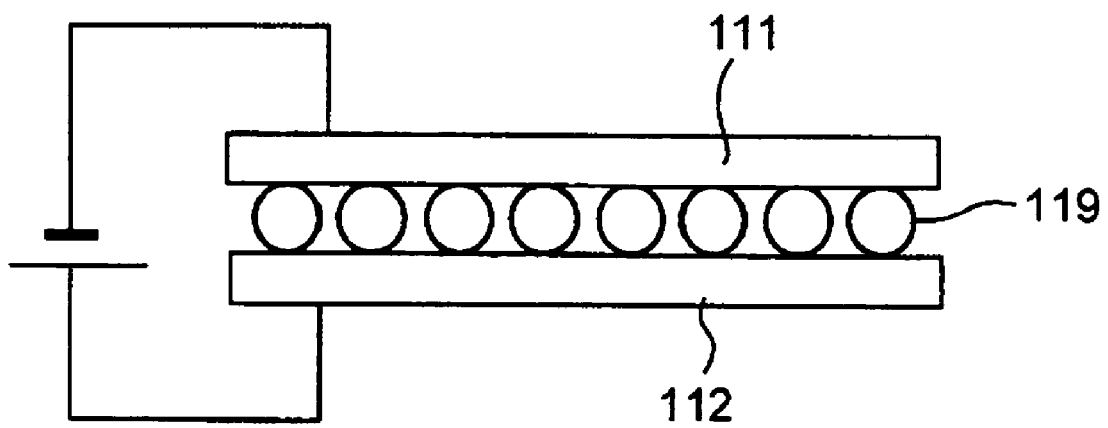
FIG. 20 is a simplified view showing a conventional electron cooling device (third prior art example)
Figure 21:
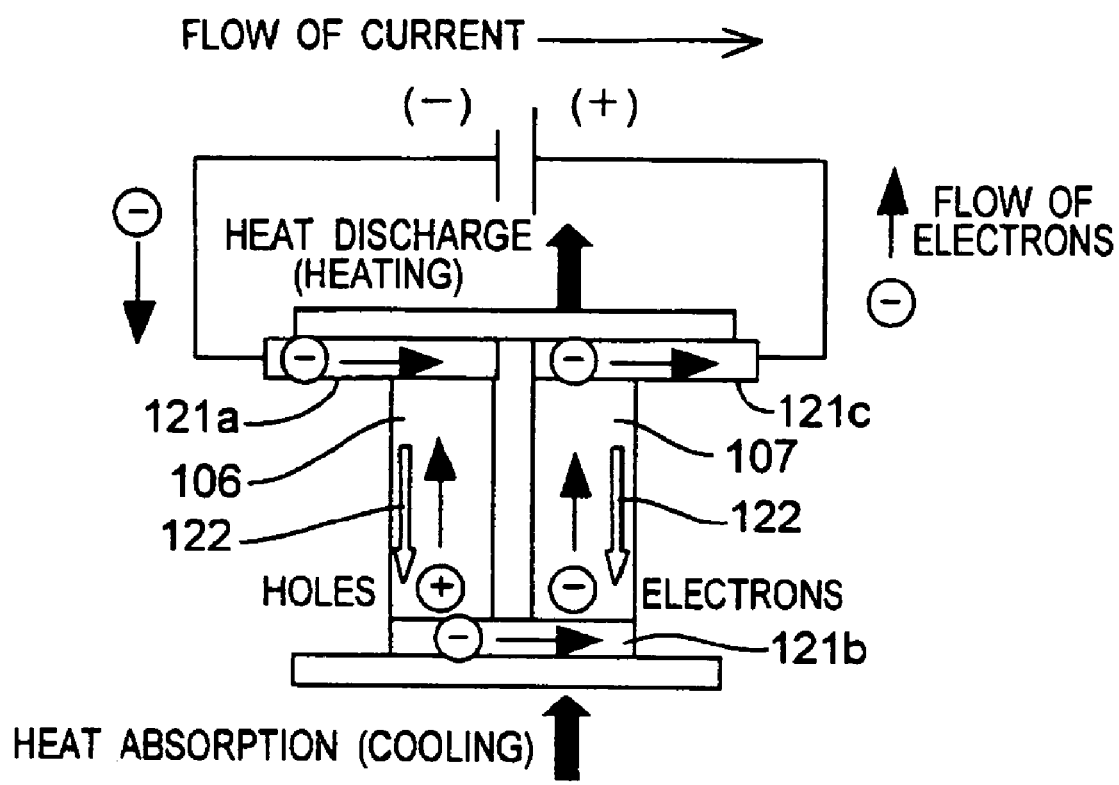
FIG. 21 is an explanatory view showing the operation of a peltiert device.
Figure 22:
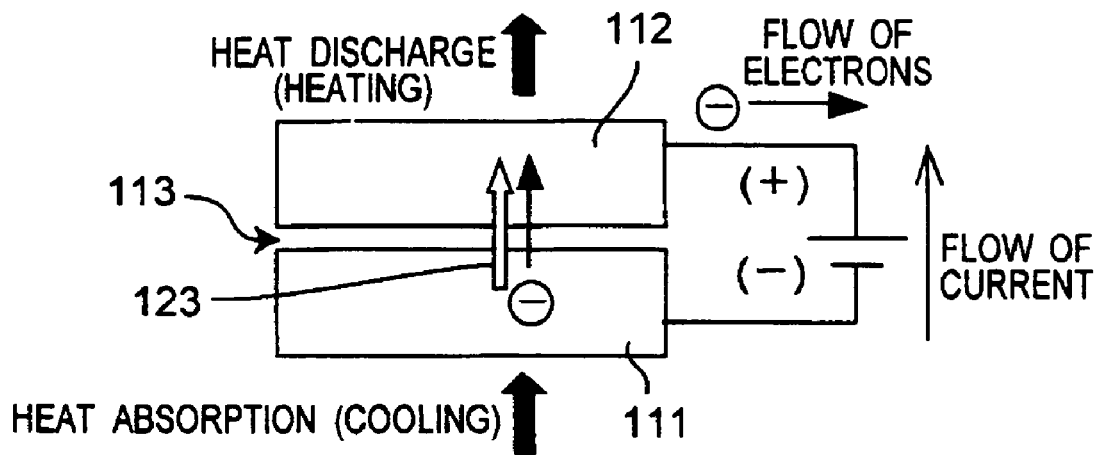
FIG. 22 is an explanatory view showing the operation of a vacuum diode-type electronic heat pump device.

Next, a laser component of the present invention, as shown in the perspective view of FIG. 16 and the main portion enlarged view of FIG. 17, includes a package 56, the electronic heat pump device 51 installed in the package is 56, a semiconductor laser diode chip 52 (hereinbelow referred to as an LD chip) mounted on the emitter-side external electrode substrate 3 of the electronic heat pump device 51, a temperature detector 61 for detecting the temperature of the LD chip 52, an electric power controller 62 for controlling electric power supplied to the electronic heat pump device 51 so as to keep the LD chip 52 at a predetermined temperature based on the temperature detected by the temperature detector 61.

Moreover, the laser component is a hologram laser component which includes a light-receiving element 54 mounted on a stem 53 inside the package 56 and a hologram device 55 attached to the external portion of the package 56, and which emits a laser beam 57 from the LD chip 52.

The temperature detector 61 detects forward voltage of the LD chip 52 to detect the temperature of the LD chip 52.

Thus, the laser component includes the electronic heat pump device 51, which allows reduction of power consumption and downsizing. Further, it becomes possible to incorporate the small-size electronic heat pump device 51 in an existing laser component package as a replacement of a submount element, which allows use of the existing laser component without changing the mounting space. For example, mounting the LD chip 52 on the electronic heat pump device 51 after mounting the electronic heat pump device 51 on the stem 53 makes it possible to use the existing laser component without changing the external size of the conventional package 56.

Moreover, the temperature detector 61 and the electric power controller 62 are provided so that only the temperature of the LD chip 52 may be kept equal to or lower than an operating environment temperature, and therefore, with small power consumption in the electronic heat pump device 51, it becomes possible to achieve an effect of reducing current applied to the LD chip 52, along with an effect of lengthening the life of the LD chip 52 which is brought about by reduction in heat value of the LD chip 52.

Description is now given of the specific operation of the laser component. As the LD chip 52, there is used a high-speed writing 200 mW optical output laser chip, which is a DVD writing red-color laser with the oscillation wavelength in the vicinity of 650 nm.

In the case of operating the LD chip 52 at the ambient temperature which sets the temperature of stem 53 at 70° C., a DC voltage of 1.45V and a DC current of 70 mA are applied from a power supply 8 to the electronic heat pump device 51, so a heat amount of 352W generated when the LD chip 52 emits an optical output of 200 mW is absorbed from the endoergic surface of the emitter-side external electrode substrate 3 and is discharged to the outside from the exoergic surface of the collector-side external electrode substrate 4 through the stem 53. As a result, the temperature of the endoergic surface of the emitter-side external electrode substrate 3 is maintained 50° C., and the temperature of the exoergic surface of the collector-side external electrode substrate 4 is maintained 70° C.

In this case, the electronic heat pump device 51 consumes electric power of 1.45V×70 mA=102 mW for cooling. Since the temperature of the LD chip 52 is lowered from 70° C. to 50° C., power consumption of the LD chip 52 is reduced by 108 mW. Further, the amount of heat discharged from the stem 53 is equal to that of the conventional hologram laser, which makes it possible to stably keep the temperature of the LD chip 52 in an optical pickup which shares a similar exoergic design without modifying the exoergic design.

It is to be noted that the temperature of the LD chip 52 is kept constant by a method in which the temperature detector 61 monitors forward voltage values in a laser drive control circuit, and the electric power controller 62 performs feedback control of electric power to be fed to the electronic heat pump device 31.

According to the first embodiment and the second embodiment, the subminiature electronic heat pump device of 0.7 mm×1.8 mm×0.7 mm can be implemented as shown in the first embodiment, and thereby the second embodiment in which the subminiature electronic heat pump device is incorporated in the semiconductor laser diode package can be implemented, which allows the LD chip to operate at a constant temperature without change in size of the laser component.

Particularly, in the case where the semiconductor laser diode is operated under high-temperature environments, the temperature of the LD chip is equal to or larger than the operating environment temperature, and therefore an operating current necessary to obtain the same optical output is increased because of the temperature characteristic of the LD chip. However, using the LD chip in combination with the electronic heat pump device of the present invention makes it possible to keep only the temperature of the LD chip equal to or lower than the operating environment temperature, and therefore, with small power consumption in the electronic heat pump, it becomes possible to achieve an effect of reducing current applied to the LD chip, along with an effect of lengthening the life of the LD chip which is brought about by reduction in heat value of the LD chip due to the reduction of the current applied thereto.

Thus, small power consumption in the electronic heat pump device allows use of the hologram laser component and the semiconductor laser component having the function to keep the LD chip at a specified temperature without modifying the exoergic design of the optical pickup.

The Third Embodiment

Next, though unshown, an optical pickup of the present invention includes the laser component. According to the optical pickup, the laser component is provided, which makes it possible to achieve the optical pickup which ensures a stable temperature of the LD chip and which is resistant to change in operating environment temperature without modification in exoergic design or modification in mounting space.

The Fourth Embodiment

Figure 23:
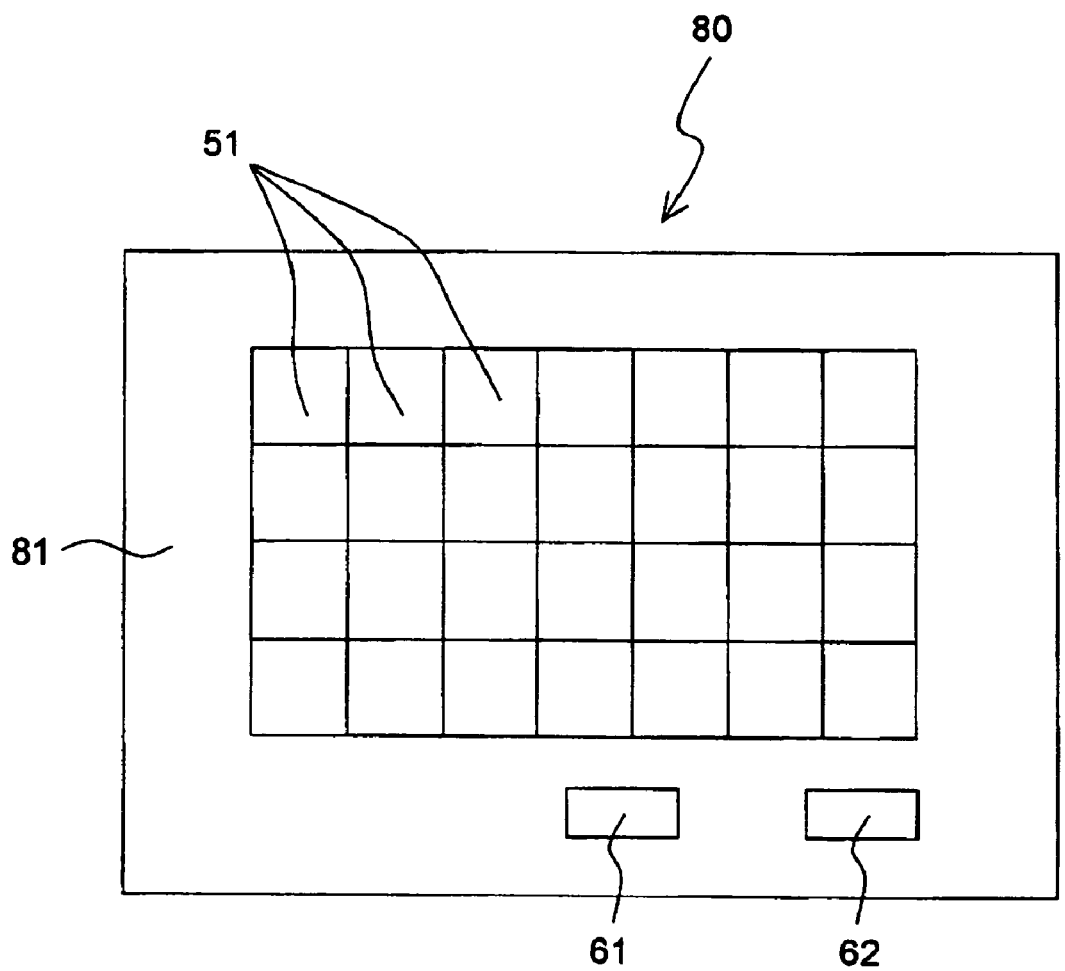
FIG. 23 is a schematic view showing an electronic equipment of the present invention.

Next, as shown in FIG. 23, an electronic equipment of the present invention includes a body 81, a plurality of the electronic heat pump devices 51 arranged thereon, the temperature detector 61 and the electric power controller 62. The electronic heat pump device 51, the temperature detector 61 and the electric power controller 62 are respectively the same as those in FIG. 17. Herein, examples of the electronic equipment include a refrigerator and an air conditioner. According to the electronic equipment, the electronic heat pump device is provided, which makes it possible to implement electronic equipment which is small in size and which allows reduction of power consumption.

It should be understood that the invention is not limited to the above embodiments, but allows, for example, manufacturing of films by other processing methods such as evaporation and CVD (Chemical Vapor Deposition) in the respective manufacturing steps. Further, the spacer section 5 may be integrally formed in at least either the semiconductor substrate 10 of the emitter 1 or the semiconductor substrate 20 of the collector 2. Further, instead of the eutectic die-bond such as Au—Su, a layer may be integrally formed on one surface of the semiconductor substrate 10 of the emitter 1 so as to allow conduction of electricity and heat to the emitter-side external electrode substrate 3, and the same holds for the collector 2 side.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic heat pump device, comprising:
an emitter-side external electrode substrate;
an emitter including a semiconductor substrate having one surface connected to the emitter-side external electrode substrate so as to allow conduction of electricity and heat, and an emitter electrode provided on the other surface of the semiconductor substrate;
a collector-side external electrode substrate;
a collector including a semiconductor substrate having one surface connected to the collector-side external electrode substrate so as to allow conduction of electricity and heat, and a collector electrode provided on the other surface of the semiconductor substrate; wherein
the emitter and the collector are disposed such that the emitter electrode and the collector electrode face each other with a space therebetween, and wherein
at least one spacer section which keeps the space between the emitter electrode and the collector electrode constant and which are electrically and thermally insulative is integrally formed in at least one of the semiconductor substrate of the emitter and the semiconductor substrate of the controller,
and further comprising:
a space retention member which is electrically and thermally insulative and disposed between the emitter-side external electrode substrate and the collector-side external electrode substrate for keeping a space between the emitter-side external electrode substrate and the collector-side external electrode substrate at a constant value; and
a sealing member for maintaining vacuum between the emitter-side external electrode substrate and the collector-side external electrode substrate.

2. The electronic heat pump device as defined in claim 1, wherein
the emitter-side external electrode substrate and the collector-side external electrode substrate have an almost rectangular parallelepiped shape.

3. The electronic heat pump device as defined in claim 1, wherein
values of maximum roughness Rz of a surface of the emitter electrode and a surface of the collector electrode are not more than $\frac{1}{2}$ of a minimum value of the space between the emitter electrode and the collector electrode.

4. The electronic heat pump device as defined in claim 1, wherein
values of maximum roughness Rz of a surface of the emitter electrode and a surface of the collector electrode are not more than $\frac{1}{4}$ of a minimum value of the space between the emitter electrode and the collector electrode.

5. The electronic heat pump device as defined in claim 1, wherein
a work function of the emitter electrode is almost equal to or lower than a work function of the collector electrode.

6. The electronic heat pump device as defined in claim 1, wherein
a plurality of the spacer sections are integrally formed in the semiconductor substrate of the collector, and are in contact with the emitter electrode, and a plurality of the spacer sections are disposed on the semiconductor substrate of the collector away from each other, and
when a ratio of a total area of a plurality of the spacer sections in contact with the emitter electrode to an area of the emitter electrode is defined as a spacer section area ratio, a relation described below is satisfied:

(spacer section area ratio)×(spacer section thermal conductivity (W/m·K))÷(spacer section thickness (nm))$\leq 3.0 \times 10^{-6}$.

7. The electronic heat pump device as defined in claim 6, wherein
a relation described below is satisfied:

(spacer section area ratio)×(spacer section thermal conductivity (W/m·K))÷(spacer section thickness (nm))$\leq 0.12 \times 10^{-6}$.

8. The electronic heat pump device as defined in claim 6, wherein a plurality of the spacer sections are distributed almost evenly on an entire surface of the semiconductor substrate of the collector and are also aligned.

9. The electronic heat pump device as defined in claim 1, wherein
the space retention member is in a tube shape, and
a relation described below is satisfied:

(space retention member thermal conductivity (W/m·K))×(space retention member thickness (mm))÷(space retention member height (mm)) $\leq 0.6$.

10. The electronic heat pump device as defined in claim 9, wherein
a relation described below is satisfied:

(space retention member thermal conductivity (W/m·K))×(space retention member thickness (mm))÷(space retention member height (mm)) $\leq 0.3$.

11. The electronic heat pump device as defined in claim 9, wherein
the space retention member is in a rectangular tube shape.

12. The electronic heat pump device as defined in claim 1, wherein
in the space between the emitter electrode and the collector electrode, there is present filler gas which has no substantial reaction against the emitter electrode and the collector electrode, and
a relation described below is satisfied:

(filler gas free molecule thermal conductivity (m/s·K))×(degree of vacuum of space (Pa)) $\leq 3350$.

13. The electronic heat pump device as defined in claim 12, therein
a relation described below is satisfied:

(filler gas free molecule thermal conductivity (m/s·K))×(degree of vacuum of space (Pa))$\leq 67$.

14. The electronic heat pump device as defined in claim 12, wherein
the filler gas is rare gas.

15. The electronic heat pump device as defined in claim 1, wherein
the emitter-side external electrode substrate and the collector-side external electrode substrate have rigidity, Young's modulus and a thickness which prevent the emitter electrode and the collector electrode from being brought into contact by compressive force generated by a pressure difference between external atmospheric pressure and internal vacuum in a state that the space retention member is in contact with a periphery portion of the emitter-side external electrode substrate and a periphery portion of the collector-side external electrode substrate.

16. The electronic heat pump device as defined in claim 15, wherein
the emitter-side external electrode substrate and the collector-side external electrode substrate have rigidity, Young's modulus and a thickness which set a deflection deformation amount of each of the emitter-side external electrode substrate and the collector-side external electrode substrate to be not more than $\frac{1}{4}$ of a minimum value of the space between the emitter electrode and the collector electrode.

17. The electronic heat pump device as defined in claim 16, wherein
the emitter-side external electrode substrate and the collector-side external electrode substrate have rigidity, Young's modulus and a thickness which set a deflection deformation amount of each of the emitter-side external electrode substrate and the collector-side external electrode substrate to be not more than $\frac{1}{5}$ of a minimum value of the space between the emitter electrode and the collector electrode.

18. A laser component, comprising:
a package;
the electronic heat pump device as defined in claim 1 installed inside the package;
a semiconductor laser diode chip mounted on the emitter-side external electrode substrate of the electronic heat pump device;
a temperature detector for detecting a temperature of the semiconductor laser diode chip; and
a electric power controller for controlling an electric power supplied to the electronic heat pump device so as to keep the semiconductor laser diode chip at a specified temperature based on the temperature detected by the temperature detector.

19. An optical pickup comprising the laser component as defined in claim 18.

20. Electronic equipment comprising the electronic heat pump device as defined in claim 1.

* * * * *